(12) United States Patent
Liang et al.

(10) Patent No.: US 10,998,862 B2
(45) Date of Patent: *May 4, 2021

(54) TEMPERATURE COMPENSATED OSCILLATOR

(71) Applicant: SKYWORKS SOLUTIONS, INC., Irvine, CA (US)

(72) Inventors: Bang Li Liang, Ottawa (CA); Thomas Obkircher, Santa Ana, CA (US); Adrian John Bergsma, Kanata (CA); Peter Harris Robert Popplewell, Ottawa (CA)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/579,120

(22) Filed: Sep. 23, 2019

(65) Prior Publication Data

US 2020/0021249 A1 Jan. 16, 2020

Related U.S. Application Data

(63) Continuation of application No. 15/808,458, filed on Nov. 9, 2017, now Pat. No. 10,461,700.

(60) Provisional application No. 62/420,806, filed on Nov. 11, 2016.

(51) Int. Cl.
| | | |
|---|---|---|
| H03F 1/30 | (2006.01) | |
| H03K 3/356 | (2006.01) | |
| H03F 3/19 | (2006.01) | |
| H03K 3/011 | (2006.01) | |
| H03K 3/354 | (2006.01) | |

(52) U.S. Cl.
CPC ............. *H03F 1/303* (2013.01); *H03F 1/301* (2013.01); *H03F 3/19* (2013.01); *H03K 3/011* (2013.01); *H03K 3/354* (2013.01); *H03K 3/356086* (2013.01); *H03K 3/356182* (2013.01)

(58) Field of Classification Search
CPC ........................................................ H03F 1/303
See application file for complete search history.

(56) References Cited

U.S. PATENT DOCUMENTS

| | | | |
|---|---|---|---|
| 6,803,803 B1 | 10/2004 | Starr et al. | |
| 6,992,533 B2 | 1/2006 | Hollinger et al. | |
| 8,901,989 B2 | 12/2014 | Mehta et al. | |
| 10,461,700 B2 * | 10/2019 | Liang | H03K 3/356086 |

* cited by examiner

*Primary Examiner* — Hai L Nguyen
(74) *Attorney, Agent, or Firm* — Lando & Anastasi, LLP

(57) ABSTRACT

Methods and systems are provided for generating an oscillating signal for use as a clock in digital logic timing. The oscillating signal is generated via a differential RC relaxation oscillator including an oscillator core and biasing circuitry. The oscillator core may be configured such that the oscillating signal it generates is substantially sinusoidal or pseudo-sinusoidal and contains less harmonic content relative to a square wave signal. The biasing circuitry may be configured to have a reduced dependence on temperature so that the biasing values it provides vary less with temperature.

20 Claims, 18 Drawing Sheets

| DOCSIS | TX LOW | TX HIGH | RX LOW | RX HIGH |
|---|---|---|---|---|
| 3.0 | 5MHz | 42MHz | 54MHz | 1002MHz |
| 3.0 | 5MHz | 85MHz | 108MHz | 1218MHz |
| 3.1 | 5MHz | 204MHz | 258MHz | 1794MHz |

TEMPERATURE COMPENSATED OSCILLATOR

This application claims priority under 35 U.S.C. § 120 as a continuation of U.S. patent application Ser. No. 15/808,458 titled TEMPERATURE COMPENSATED OSCILLATOR filed on Nov. 9, 2017, now U.S. Pat. No. 10,461,700 B2 issued on Oct. 29, 2019, which claims the benefit under 35 U.S.C. § 119(e) of U.S. Provisional Patent Application No. 62/420,806 titled TEMPERATURE COMPENSATED OSCILLATOR filed on Nov. 11, 2016, each of which is herein incorporated by reference in its entirety for all purposes.

This application further relates to U.S. patent application Ser. No. 15/808,486 filed on Nov. 9, 2017, and titled HIGH-LINEARITY VARIABLE GAIN AMPLIFIER WITH BYPASS PATH, now U.S. Pat. No. 10,439,576, which claims the benefit under 35 U.S.C. § 119(e) of U.S. Provisional Patent Application No. 62/420,326 titled HIGH-LINEARITY VARIABLE GAIN AMPLIFIER WITH BYPASS PATH filed on Nov. 10, 2016, each of which is herein incorporated by reference in its entirety for all purposes.

This application further relates to U.S. patent application Ser. No. 15/808,341 filed on Nov. 9, 2017, and titled WIDE DYNAMIC RANGE AMPLIFIER SYSTEM, now U.S. Pat. No. 10,396,737, which claims the benefit under 35 U.S.C. § 119(e) of U.S. Provisional Patent Application No. 62/420,875 titled WIDE DYNAMIC RANGE AMPLIFIER SYSTEM filed on Nov. 11, 2016, each of which is herein incorporated by reference in its entirety for all purposes.

This application further relates to U.S. patent application Ser. No. 15/808,389 filed on Nov. 9, 2017, and titled AMPLIFIER SYSTEM WITH DIGITAL SWITCHED ATTENUATOR, now U.S. Pat. No. 10,396,735, which claims the benefit under 35 U.S.C. § 119(e) of U.S. Provisional Patent Application No. 62/420,681 titled AMPLIFIER SYSTEM WITH DIGITAL SWITCHED ATTENUATOR filed on Nov. 11, 2016, each of which is herein incorporated by reference in its entirety for all purposes.

This application further relates to U.S. patent application Ser. No. 15/808,372 filed on Nov. 9, 2017, and titled TRANSIENT OUTPUT SUPPRESSION IN AN AMPLIFIER, which claims the benefit under 35 U.S.C. § 119(e) of U.S. Provisional Patent Application No. 62/420,907 titled TRANSIENT OUTPUT SUPPRESSION IN AN AMPLIFIER filed on Nov. 11, 2016, each of which is herein incorporated by reference in its entirety for all purposes.

This application further relates to U.S. patent application Ser. No. 15/808,358 filed on Nov. 9, 2017, and titled REDUCING IMPEDANCE DISCONTINUITIES ON A SHARED MEDIUM, now U.S. Pat. No. 10,256,921, which claims the benefit under 35 U.S.C. § 119(e) of U.S. Provisional Patent Application No. 62/421,084 titled REDUCING IMPEDANCE DISCONTINUITIES ON A SHARED MEDIUM filed on Nov. 11, 2016, each of which is herein incorporated by reference in its entirety for all purposes.

BACKGROUND

Complex integrated circuits (ICs) often use a clock signal to control digital logic timing. Minimizing the power consumption and area of these circuits is often desirable in order to increase portability, enhance performance, and decrease cost.

SUMMARY

In certain applications it is desirable to produce a clock signal having a stable output frequency, particularly at its fundamental frequency where the signal strength is often most concentrated. It can also often be desirable to produce a clock signal that is resistant to changes in certain parameters or environmental conditions, such as temperature, supply voltage, and variations in manufacturing processes. In some applications, clock circuitry can be configured to enter a low-power or sleep state in which it consumes less power while not being used. However, it can be important that the clock circuitry be able to quickly wake up from sleep mode and begin producing a useful, stable clock signal as quickly as possible. In systems that use clock circuitry to generate the clock signal, it can also be desirable to integrate the clock circuitry onto the same integrated circuit (IC) as additional circuitry that utilizes the clock signal, such as communications circuitry. Integrating the clock circuitry onto the same IC as the additional circuitry can, for example, reduce the overall area footprint of the entire system and therefore reduce manufacturing costs.

In an IC having multiple systems, a clock signal can unintentionally couple to and potentially interfere with another signal if the two signals possess sufficiently overlapping frequency content. For example, modern communications systems typically transmit and receive broadband signals, which are dissected into narrowband signals using techniques such as orthogonal frequency division multiplexing (OFDM). A clock signal being used within such a communications system is more likely to interfere with one or more communications signals if the clock signal's fundamental frequency, or one of its harmonics, has sufficient amplitude and overlaps the communications band of the one or more communications signals.

Conventional approaches for designing a clock signal are not sufficiently fast, compact, low-power, sinusoidal, and PVT (process-voltage-temperature) resistant to function optimally in modern, hi-bandwidth communications systems such as a Data Over Cable Service Interface Specification (DOCSIS) 3.1 upstream power amplifier controller.

Phase-locked loops (PLLs) or crystal oscillators are two designs used for clock signal generation that have relatively accurate and tight frequency content, but are typically expensive, power-intensive, and/or require a large on-die area. Some PLL or crystal oscillator implementations may even require external, off-die components. Both of these clock signaling methods are relatively slow to turn on and off compared to other methods.

Current controlled oscillators (CCOs) are another clock signal generation design. CCOs are also slow to turn on and generate square-wave clock signals, which are often undesirable due to their greater harmonic content relative to sinusoidal waveforms. In addition, since CCOs are current-biased they generally require more power-hungry and area-intensive biasing circuitry in order to achieve temperature insensitivity. For example, a CCO may be biased using a bandgap based voltage-to-current generator that sums a proportional to absolute temperate (PTAT) current with a complementary to absolute temperature (CTAT) current in order to create a temperature insensitive bias current.

Inductive-capacitive (LC) oscillators are another approach capable of achieving a very accurate clock signal frequency. While LC oscillators may be configured to be relatively voltage and temperature insensitive, creating a clock in the 1-10 MHz range requires one or more large inductor(s) and capacitor(s), which are difficult to produce on-die and tend to be both area and power intensive.

Aspects and embodiments are directed to processes and apparatus for generating a low-power clock signal using a single-stage, compact, differential resistive-capacitive (RC)

relaxation oscillator whose behavior may be configured to be resistant to variations in process, voltage, and temperature (PVT) and generates a smooth or pseudo-sinusoidal waveform. The RC oscillator may be embodied as a stand-alone device or integrated as part of an overall digital logic system. For example, in some embodiments the RC oscillator is implemented as part of a power amplifier control system.

According to one embodiment, the RC oscillator includes biasing circuitry used to set a stable reference current or voltage that is used to bias an oscillator core. The oscillator core is activated in response to being biased by the stable reference current or voltage and one or more nodes within the oscillator core responsively begin oscillating at a certain fundamental frequency. Additional systems such as intermediate biasing circuitry, startup and enable circuitry, or one or more output buffers may be further included in the system in order to further improve certain characteristics and behavior, as discussed further below.

In many cases, the bias currents and/or voltages used to bias the oscillator core of the RC oscillator may be temperature dependent, and thus the fundamental frequency output by the oscillator core may vary with temperature in response (temperature dependence). Accordingly, it may be desirable to reduce the temperature dependence of one or more of the bias currents or voltages in order to reduce variations in the oscillator output frequency with temperature. In one embodiment, a proportional to absolute temperature (PTAT) bias current is generated and coupled either directly to the oscillator core or to intermediate biasing circuitry. The transistors or resistors used to form a PTAT bias current may be intentionally sized in order to reduce the temperature sensitivity of the PTAT bias current, which in turn will reduce the temperature sensitivity of the oscillator core.

As discussed further below, in certain embodiments, the RC oscillator may be coupled to a clock distribution network of an external digital logic system and used to control timing within the external system. For example, the RC oscillator may couple to the clock distribution network of an upstream power amplifier controller, such as an upstream power amplifier designed for use in the DOCSIS 3.1 5 MHz to 204 MHz communications standard. In certain embodiments, the RC oscillator is used in digital logic circuits that use signaling frequencies distinct from the fundamental frequency output by the oscillator. Using non-overlapping frequencies may, for example, enable the oscillator to control timing within the digital logic circuit without undesirably interfering with other signals being used in the digital logic circuit, such as communications signals.

The RC oscillator may be further configured to produce a smooth or pseudo-sinusoidal output waveform. A smooth waveform refers to a function that is continuous over time and whose derivatives are continuous over time up to a certain order n. The value of n depends on the level of smoothness desired and can range anywhere from one to infinity. Thus a first-order (n=1) smooth function's first derivative will be fully continuous, a second-order (n=2) smooth function's first and second derivatives will be fully continuous, etc. A pseudo-sinusoidal waveform refers to a function that is substantially similar to a sinusoidal function. The level of similarity required to characterize a function as pseudo-sinusoidal can vary depending on the level of harmonic content needing to be attenuated, as described below. In various examples, a pseudo-sinusoidal function may be smooth or a smooth function may be pseudo-sinusoidal. Visually, a smooth or pseudo-sinusoidal waveform may be characterized by having no observable sharp corners or abrupt inflection points, or, in certain cases, having minimal observable corners or abrupt inflection points (when viewed on an appropriate time scale in which the shape of each period is sufficiently discernable).

A smooth or pseudo-sinusoidal output waveform will possess a lesser degree of harmonic content relative to a square or triangular waveform (or less smooth/less sinusoidal waveform) otherwise having the same amplitude. Reducing the harmonic content of the oscillator output waveform helps prevent one or more harmonics of the output waveform from undesirably coupling to and interfering with other signals being used in a connected digital logic circuit, such as communications signals (for example transmission or reception signals in a DOCSIS 3.1 system).

In some embodiments, power savings can be achieved by adding an enable system configured to toggle the RC oscillator between an active mode and a sleep mode. As discussed further below, the RC oscillator can be configured to be able to quickly exit sleep mode and enter active mode responsive to receiving a startup or enable signal. In one embodiment, the device is able to exit sleep mode and enter active mode within a single oscillator clock cycle (based on the fundamental frequency output by RC oscillator) of receiving the enable signal. This quick responsiveness allows a system incorporating the oscillator (such as a DOCSIS 3.1 amplifier system) to power down one or more components of the oscillator for as long as possible until just before the oscillator's output signal is required, thereby conserving power.

According to one aspect, provided is a relaxation oscillator including a proportional to absolute temperature (PTAT) biasing unit configured to output a bias signal, the PTAT biasing unit being formed in an integrated circuit; an additional biasing unit configure to receive the bias signal from the PTAT biasing unit and generate an output signal based on the bias signal; and an oscillator core configured to generate an oscillating signal upon receiving the output signal from the additional biasing unit, the oscillating signal having a smooth profile and a fundamental frequency of less than five megahertz (MHz), the oscillator core being formed in the integrated circuit with the PTAT biasing unit and the additional biasing unit.

In certain examples, the relaxation oscillator includes a first branch having a first transistor and configured to output the oscillating signal, a second branch including a second transistor and configured to output an additional oscillating signal, and a capacitor coupling the first branch to the second branch, wherein a gate of the first transistor is coupled to the second branch and a gate of the second transistor is coupled to the first branch.

In various examples, the relaxation oscillator includes wherein the fundamental frequency of the oscillating signal varies by less than plus or minus ten percent when operating over a temperature range between 0° C. and 120° C. In various examples, the relaxation oscillator further includes an enable unit coupled to the oscillator core and configured to shunt at least one of the bias signal and the input signal to a ground responsive to receiving a sleep mode signal. According to some examples, the relaxation oscillator includes at least one output buffer coupled to the oscillator core and configured to receive and buffer the oscillating signal and to output a buffered oscillating signal. In some examples, the relaxation oscillator includes a low drop-out (LDO) regulator coupled to each of a supply voltage, the PTAT biasing unit, and the oscillator core, the LDO regulator configured to receive the supply voltage and to provide a regulated supply voltage to each of the PTAT biasing unit and the oscillator core, wherein the fundamental frequency is between 4.23 MHz and 4.27 MHz when the regulated supply voltage is between 3 V and 3.6 V.

According to certain examples, the relaxation oscillator includes wherein the fundamental frequency is between 3.8 MHz and 4.5 MHz when the oscillator core is operating at a temperature between 0° C. and 120° C. In some examples, the relaxation oscillator includes wherein the fundamental frequency is between 3.8 MHz and 4.1 MHz when a supply voltage is between 3 V and 3.6 V. In still other examples, the relaxation oscillator further includes wherein each of the oscillator core, the PTAT biasing unit, and the additional biasing unit are fabricated using at least one of Silicon (Si), Germanium (Ge), and Gallium arsenide (GaAs). In various examples, the relaxation oscillator includes wherein each of the oscillator core, the PTAT biasing unit, and the additional biasing unit are fabricated using at least one of complementary metal-oxide semiconductor (CMOS), Silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), or enhancement/depletion mode (E/D-mode) pHEMT processes.

According to various examples, the relaxation oscillator further includes wherein signal magnitudes of first through fiftieth harmonics of the oscillating signal are attenuated by at least a factor of two relative to a signal magnitude of the fundamental frequency. In some examples, the relaxation oscillator includes at least one power amplifier system formed in the integrated circuit with the oscillator core, the PTAT biasing unit, and the additional biasing unit. In a further example, the relaxation oscillator further includes at least one controller formed in the integrated circuit with the oscillator core, the PTAT biasing unit, and the additional biasing unit.

According to another aspect, provided is a relaxation oscillator including a proportional to absolute temperature (PTAT) biasing unit configured to output a bias signal, the PTAT biasing unit being formed in an integrated circuit; and an oscillator core configured to generate an oscillating signal upon receiving the bias signal, the oscillating signal having a smooth profile and a fundamental frequency of less than five megahertz (MHz), the oscillator core being formed in the integrated circuit with the PTAT biasing unit.

In various examples, the relaxation oscillator includes wherein the fundamental frequency of the oscillating signal varies by less than plus or minus ten percent when operating over a temperature range between 0° C. and 120° C. According to certain examples, the relaxation oscillator further includes an enable unit coupled to the oscillator core and configured to shunt at least one of the bias signal and the input signal to a ground responsive to receiving a sleep mode signal. In still other examples, the relaxation oscillator further includes at least one output buffer coupled to the oscillator core and configured to receive and buffer the oscillating signal and to output a buffered oscillating signal.

In certain examples, the relaxation oscillator further includes a low drop-out (LDO) regulator coupled to each of a supply voltage, the PTAT biasing unit, and the oscillator core, the LDO regulator configured to receive the supply voltage and to provide a regulated supply voltage to each of the PTAT biasing unit and the oscillator core, wherein the fundamental frequency is between 4.23 MHz and 4.27 MHz when the regulated supply voltage is between 3 V and 3.6 V. In other examples, the relaxation oscillator further includes wherein each of the oscillator core and the PTAT biasing unit are fabricated using at least one of Silicon (Si), Germanium (Ge), and Gallium arsenide (GaAs). In various examples, the relaxation oscillator further includes wherein each of the oscillator core and the PTAT biasing unit are fabricated using at least one of complementary metal-oxide semiconductor (CMOS), Silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), or enhancement/depletion mode (E/D-mode) pHEMT processes.

According to some examples, the relaxation oscillator includes wherein signal magnitudes of first through fiftieth harmonics of the oscillating signal are attenuated by at least a factor of two relative to a signal magnitude of the fundamental frequency. In certain other examples, the relaxation oscillator further includes at least one power amplifier system formed in the integrated circuit with the oscillator core and the PTAT biasing unit. In various additional examples, the relaxation oscillator further includes at least one controller formed in the integrated circuit with the oscillator core and the PTAT biasing unit.

These exemplary aspects, examples, and embodiments are discussed in detail below, along with other aspects, examples, embodiments, and advantages. Examples and embodiments disclosed herein may be combined with other examples or embodiments in any manner consistent with at least one of the principles disclosed herein, and references to "an example," "some examples," "an alternate example," "various examples," "one example", "implementations", "embodiments", or the like are not necessarily mutually exclusive and are intended to indicate that a particular feature, structure, or characteristic described may be included in one or more examples or implementations. The appearances of such terms herein are not necessarily all referring to the same example or implementation.

Furthermore, in the event of inconsistent usages of terms between this document and documents incorporated herein by reference, the term usage in the incorporated references is supplementary to that of this document; for irreconcilable inconsistencies, the term usage in this document controls.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Figures 1, 2:
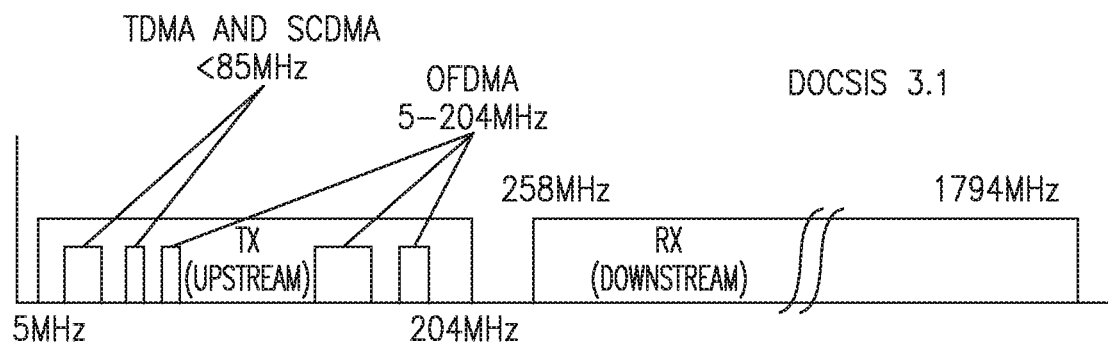
FIG. 1 is a table illustrating the frequency spectrum allocations made under various iterations of the DOCSIS 3.0 and 3.1 standards.
FIG. 2 is an illustration of the DOCSIS 3.1 frequency plan, with the x-axis representing frequency.

Aspects and embodiments are directed to a compact, low-power differential RC relaxation oscillator for providing a clock signal for use in a digital logic circuit. According to certain embodiments, the RC oscillator uses a proportional to absolute temperature (PTAT) biasing unit with reduced temperature sensitivity in order to produce an output signal with a fundamental frequency that is resistant to variations in temperature. Some embodiments of the RC oscillator may include a low drop-out (LDO) regulator, and optionally other circuitry, to reduce the sensitivity of the oscillator output frequency to variations in the supply voltage and/or manufacturing processes.

The differential RC relaxation oscillator is configured to produce a smooth or pseudo-sinusoidal output in order to reduce the presence of undesirable harmonic frequencies. As used herein, the term "pseudo-sinusoidal" is intended to refer to a smooth waveform having an oscillating profile and lacking sharp or abrupt inflection points, such that the waveform has reduced harmonic content relative to a square-wave signal having the same fundamental frequency and amplitude. In one embodiment, the device is configured to produce a fundamental output frequency between 3 MHz and 5 MHz over a temperature range of 0° C. and 120° C. In other embodiments, the device is configured to produce a fundamental output frequency between 0.1 MHz and 100 MHz for use in various digital logic applications requiring a clock frequency outside of the 3 MHz to 5 MHz band. In still other implementations, the device may be configured to produce a fundamental output frequency in another range, as will be appreciated by those skilled in the art, given the benefit of this disclosure.

The RC oscillator may be operable in both an active mode and a sleep mode and configured to quickly switch between the sleep mode and the active mode and vice versa. The device is further configured to draw a relatively low amount of current in both active and sleep modes. In some embodiments, the RC oscillator draws less than 100 nA of current while in sleep mode and less than 100 µA of current while in active mode. Drawing a lower amount of current may, for example, enable the device to consume a lower amount of power or produce less heat.

The RC oscillator may be fabricated on an integrated circuit (IC) wafer or die using one of the many IC process technologies known to those in the art. For example, the RC oscillator may be integrated in a substrate or die manufactured from various semiconductor materials, such as Silicon (Si), Germanium (Ge), or Gallium arsenide (GaAs), using various design technologies such as complementary metal-oxide semiconductor (CMOS), silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other known semiconductor materials and technologies.

The RC oscillator may be part of a larger digital logic system. For example, the RC oscillator may be coupled to a power amplifier (PA) control system. In certain embodiments, all or part of the larger digital logic system including the RC oscillator may be fabricated on a single chip. The single chip may be created using a single IC fabrication process or using multiple IC fabrication processes in combination. For example, a digital logic chip containing the RC oscillator can be integrated in a substrate or die manufactured from various semiconductor materials, such as Silicon (Si), Germanium (Ge), or Gallium arsenide (GaAs), using various design technologies such as complementary metal-oxide semiconductor (CMOS), silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other known semiconductor materials and technologies. Different subsystems may each be fabricated using a unique IC material or process, or set of IC materials and processes. For example, within a larger digital system the RC oscillator subsystem may be fabricated using one set of IC materials and processes, while another subsystem may be fabricated using a different set of IC materials and processes.

In one embodiment featuring the RC oscillator as part of a larger digital logic system patterned onto a single chip, the RC oscillator subsystem occupies less than 5% of the total chip area. In some embodiments, the RC oscillator may occupy less than 1% of the total chip area, which may be less than 300 µm by 70 µm.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

As discussed above, certain embodiments of the RC oscillator described herein can be used in a digital logic system, for example, to provide a stable clock signal to control timing within a larger device or system. For example, the RC oscillator may be coupled to the clock distribution network of an upstream power amplifier controller, such as an upstream power amplifier designed for use in the DOCSIS 3.1 5 MHz to 204 MHz communications standard.

The Data Over Cable Service Interface Specifications (DOCSIS) are developed by CableLabs, a non-profit consortium of cable operators focused on technologies and specifications for delivery of data, video, voice, and next generation services. DOCSIS defines the signal parameters for communications transmissions over a cable service infrastructure.

The DOCSIS 3.1 specification follows upon the DOCSIS 3.0 specification and includes significant changes to the interface specification for Cable Modems (CM's) and for Cable Modem Termination Systems (CMTS's). In a system for data over cable service, multiple sites, or customer premises, are typically connected to a common waveguide medium, such as a coaxial cable, that terminates at a hub operated by a cable operator. Each of the customer premises will have one or more cable modems that receive data signals from the hub in a downstream direction and transmit data signals to the hub in an upstream direction. A cable modem termination system is placed at the hub and receives the individual upstream data signals from the cable modems and transmits the downstream data signals. Every data signal transmission is received by all other stations, CM's or the CMTS, coupled to the common, i.e., shared, medium. The data signals, downstream and upstream, include addressing information identifying to which cable modem they pertain, and each cable modem on the common medium generally ignores data signals not intended for it.

The cable modems on a common medium receive instructions from the CMTS directing the cable modems as to signal formatting and transmission parameters each cable modem is to use for their upstream transmissions. In particular, once associated with the network, each cable modem only transmits upstream data signals when capacity on the shared medium is assigned, or allocated, to it by the CMTS. DOCSIS 3.0 standardized upstream transmissions by the cable modems in two potential modes, TDMA mode and S-CDMA mode. Each mode includes frequency and time slot allocations to the cable modems, i.e., Frequency Division Multiple Access (FDMA) and Time Division Multiple Access (TDMA). The CMTS communicates frequency and time allocations in a particular Media Access Control (MAC) Management Message known as a bandwidth allocation map (MAP) message. Time allocations are given in mini-slots that are an integer multiple of 6.25 microseconds (uS). Modulation to be used by the cable modem is also assigned by the CMTS and is communicated in an Upstream Channel Descriptor (UCD) of a MAC Management Message. The fundamental upstream modulation scheme is Quadrature Amplitude Modulation (QAM) with a constellation size up to 128, and the coding scheme includes Reed-Solomon (R-S) Forward Error Correction (FEC) coding, also with Trellis Coded Modulation (TCM) in North America. The S-CDMA mode further incorporates Synchronous Code Division Multiple Access (S-CDMA) as part of the modulation scheme.

According to DOCSIS 3.0, the spectrum available for allocation to upstream transmissions is from 5 MHz up to 85 MHz, just over four octaves. Depending upon the number of channels allocated, a cable modem must support a data signal transmission burst with power output (to a 75 Ohm medium, e.g., coaxial cable) per channel up to 53 dBmV or 56 dBmV in S-CDMA mode, and possibly up to 61 dBmV in TDMA mode. Power output from each cable modem is also controlled by the CMTS. In a process called ranging, the CMTS instructs each cable modem to increase or decrease transmission power such that upstream data signals arriving at the CMTS arrive with substantially the same signal levels regardless of which cable modem sent the signals. Cable modems that are further away from the CMTS on the shared medium may need to transmit with higher power to compensate for additional attenuation associated with a physically longer propagation along the length of the shared medium. Cable modems closer to the CMTS, along the shared medium, may need to transmit with lower power because their signals travel a shorter distance along the shared medium, causing less attenuation.

Evolution in the cable industry, particularly in the cable television service, has resulted in the reduction or elimination of traditional analog television channels that previously utilized frequencies as low as 54 MHz in the United States. This has freed spectrum within the cable system infrastructure, and the progression of DOCSIS specifications has begun to incorporate more of this spectrum. DOCSIS 3.1, for example, specifies an upstream frequency range of 5 MHz up to 204 MHz, which is almost 2.5 times the maximum frequency range of DOCSIS 3.0, covering more than five and a third octaves.

In addition to the extended frequency ranges and accordingly expanded bandwidths, DOCSIS 3.1 brings new modulation and coding schemes into the cable data services industry. DOCSIS 3.1 implements orthogonal frequency division multiple access (OFDMA) into the upstream channels, and allows allocation by the CMTS to the CM of a frequency range, rather than individual channels, and within the frequency range there are multiple subcarriers of either 25 kHz or 50 kHz spacing. To allow for backwards compatibility, a CMTS may continue to allocate channels within DOCSIS 3.0 frequency ranges, modulation, and coding schemes. Additionally, full compliance with DOCSIS 3.1 requires support for power output up to 65 dBmV into 75 Ohm loads across the entire spectrum. Cable modem manufacturers may further require higher output signal levels, of, for example, 68 dBmV or higher.

The DOCSIS 3.1 specification also has strict requirements for Noise Figure (NF), Modulation Error Rate (MER) and spurious emissions across the entire spectrum. Conventional cable modems have not been able to meet the DOCSIS 3.1 specifications over the full 5-204 MHz spectrum and have instead implemented the newer modulation scheme of the DOCSIS 3.1 specification over only the conventional spectrum of 5-85 MHz. In the near future, however, demand will increase to the point that cable modem manufacturers will be required to support the full spectrum of the DOCSIS 3.1 specification from 5-204 MHz.

In addition to the requirement to support power output up to 65 dBmV into 75 Ohms across the entire upstream spectrum from 5-204 MHz with accompanying noise figure, modulation error rate, and spurious emissions limitations, a cable modem also must be capable of adjusting upstream output power to accommodate ranging operations of the CMTS, i.e., to adjust output power as instructed by the CMTS such that the data signals received at the CMTS from all cable modems in the system arrive with substantially the same power. For example, cable modems whose transmissions must transit a longer length of coaxial cable will be attenuated by the cable more so than transmissions from cable modems that have a shorter length of cable to transit. A typical conventional cable modem may provide an output power adjustable in 1 dB steps from about 5 dBmV up to about 64 dBmV, with various noise figure, modulation error ratio, and spurious emission limits, across the DOCSIS 3.0 spectrum with a high end frequency of 42 MHz or 85 MHz. As described above, DOCSIS 3.1 more than doubles this high end frequency to 204 MHz, while maintaining the lower edge of 5 MHz.

Radio Frequency (RF) power amplifier manufacturers for the cable modem industry are challenged to design amplifiers capable of providing adjustable signal output powers spanning 58 dB or more (e.g., 10-68 dBmV at 75 Ohms) across a frequency band spanning more than 5 octaves (e.g., 5-204 MHz), while maintaining stringent noise figure and modulation error ratio requirements across all output signal levels and frequencies. Additionally, at least because cable modems connect to a shared medium, they are desired to behave well in other regards, such as to present a consistent impedance to the cable to avoid electromagnetic reflections, and to limit spurious emissions.

FIG. 1 is a table illustrating the frequency spectrum allocations made under DOCSIS 3.0 and 3.1. Each specifies at least one pair of low and high edge frequencies for a transmit range and a receive range. The terms transmit and receive in the table are from the perspective of a cable modem. That is, the transmit frequency range is the upstream range, for data signals sent from a cable modem (CM) to a cable modem termination system (CMTS), and the receive frequency range is the downstream range, for data signals sent from the CMTS to one or more CM's. It can be seen from the table of FIG. 1 that the DOCSIS standard has evolved over time to increase the frequency allocations to each of the upstream (transmit) and downstream (receive) frequency ranges.

FIG. 2 is an illustration of the DOCSIS 3.1 frequency plan, with an x-axis for frequency, the upstream range of 5-204 MHz on a lower (left) range of the x-axis and the downstream range of 258-1794 MHz on an upper (right) range of the x-axis. DOCSIS 3.1 allows for some optional lower ranges, but a full, maximum bandwidth implementation of DOCSIS 3.1 is as shown.

Figure 3:
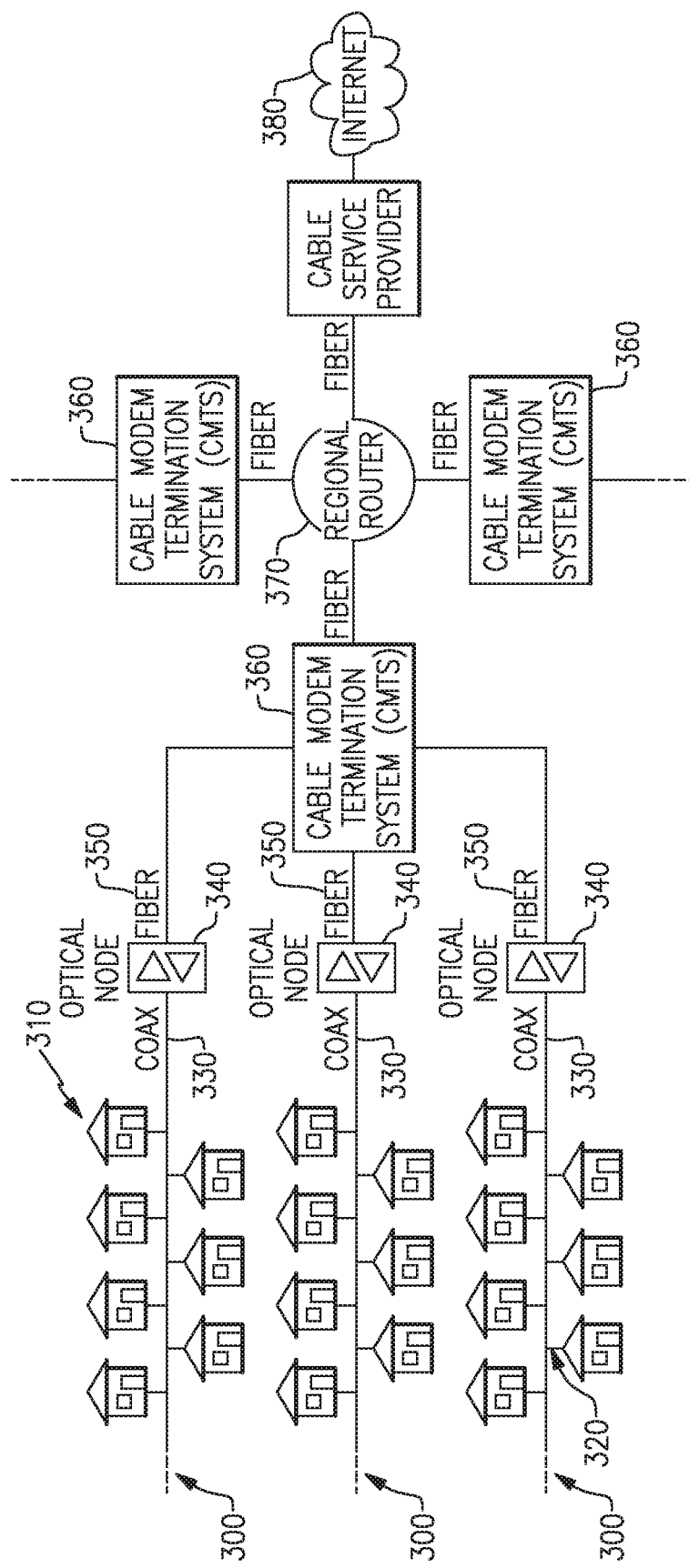
FIG. 3 is a schematic diagram for data over cable service in a residential environment implemented with a hybrid fiber-coaxial system.

FIG. 3 is a schematic diagram for data over cable service in a residential environment implemented with a hybrid fiber-coaxial architecture. Shown in FIG. 3 are three distribution branches 300 serving multiple houses, or customer premises 310, each connected by at least one drop 320 from one of the distribution branches 300. Each customer premises 310 has a cable modem connected to a coaxial cable. Customer premises 310 that are connected via the same distribution branch 300 share a coaxial medium 330 in the neighborhood, such that all data signal transmissions on the shared coaxial medium 330 may be observed at, and may have an impact upon, other cable modems connected to the shared coaxial medium 330. In a hybrid fiber-coax system like that shown in FIG. 3, each distribution branch 300 coaxial medium 330 connects to an optical node 340 that converts radio frequency (RF) electrical signals from the coaxial medium 330 to optical signals on a fiber optic cable 350, and vice versa. The fiber optic cable 350 delivers the optical signals to a cable modem termination system (CMTS) 360. For purposes of the disclosure herein, the cable modems may be considered to communicate directly with the CMTS 360 via electrical radio frequency signals on the coaxial medium 330. Beyond the CMTS 360, and as shown for example in FIG. 3, the CMTS 360 may communicate with a regional router 370 and ultimately to a further network 380. Other examples of data over cable services may include other equipment and may provide services to commercial rather than residential customer premises.

Figure 4:
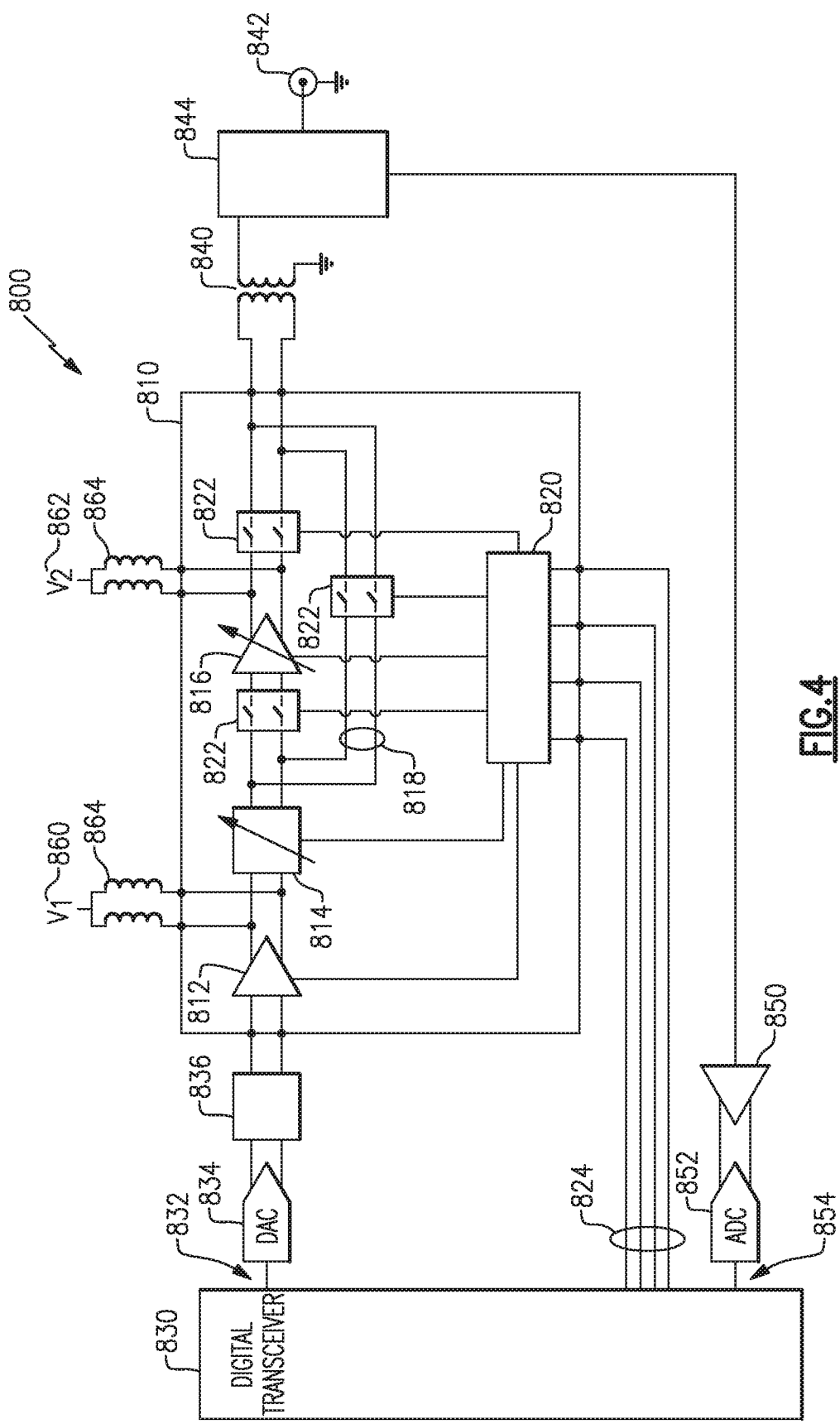
FIG. 4 is a schematic diagram of a cable modem incorporating an amplifier system in accord with aspects and embodiments disclosed herein.

FIG. 4 is a schematic diagram of a cable modem 800 incorporating an example of an amplifier system 810. In this example, the amplifier system 810 includes a fixed amplifier input stage 812, an adjustable attenuator 814, a variable gain amplifier 816, and a bypass path 818. The fixed amplifier input stage 812, adjustable attenuator 814, variable gain amplifier 816, and the bypass path 818 may each be differential elements having two differential inputs and two differential outputs. The amplifier system 810 also includes a controller 820 that controls settings of the fixed amplifier input stage 812, the adjustable attenuator 814, and the variable gain amplifier 816, as discussed further below, as well as controlling various switches 822 to route a signal through, alternatively, the variable gain amplifier 816 or the bypass path 818. The controller 820 may receive instructions via a control interface 824 from a digital transceiver 830. The digital transceiver 830 receives and generates digital data signals to communicate user data from a local network to the CMTS. As discussed above, it is to be understood that not all elements of a cable modem are shown in FIG. 4, additional components and circuitry may be included that are not shown, such as up-converters and down-converters, for example.

When transmitting, the digital transceiver 830 provides a digital transmit signal 832 to a digital to analog converter (DAC) 834. The DAC 834 converts the digital transmit signal 832 into analog signals that may be filtered by a filter 836 before being provided to the input of the amplifier system 810 at the input stage 812. The amplifier system 810 may apply a variable gain to the transmit signal to increase or decrease the signal level in accord with instructions given to the controller 820 by the digital transceiver 830. The desired gain can typically be selected by the digital transceiver 830 in response to commands from the CMTS to increase or decrease the transmit signal level. A balun 840 may be used to couple the transmit signal (provided by the amplifier system 810 at the desired signal level) to a coaxial cable connector 842. The balun 840 converts the signal from a differential and balanced form to an unbalanced form, and matches the signal to the impedance of a cable expected to be connected to the connector 842, e.g., 75 Ohms in typical coaxial cable distribution systems. Additionally, the transmit signal may pass through a duplexer 844. The duplexer 844 separates transmit signals from receive signals by, for example, separating signals by frequency range, for example with a combination of a high pass filter and a low pass filter. The duplexer 844 may provide received signals to a low noise amplifier 850 that amplifies the received signals prior to a conversion into digital form by an analog to digital converter (ADC) 852 that provides a digital receive signal 854 to the digital transceiver 830. Also illustrated in FIG. 4 are power connections 860, 862 that may independently provide power to the input stage 812 and the variable gain amplifier 816 via inductors 864, 866. For example, in at least one embodiment, the fixed amplifier input stage 812 may be supplied from a 3.3V supply and the variable gain amplifier 816 may be supplied from a 10V supply. A bias current or voltage supplied to either of the fixed amplifier input stage 812 or the variable gain amplifier 816 may be varied to improve the efficiency of the stage or amplifier.

The amplifier system 810 may be implemented in a number of physical technologies and topologies. As discussed above, the amplifier system may include the fixed amplifier input stage 812, the adjustable attenuator 814, the variable gain amplifier 816, and the bypass signal path 818, or any combination or subset of these, implemented in various arrangements and manufactured from various techniques. Any of these components may be implemented in a substrate or in a die and may be designed for and manufactured from various semiconductor materials, such as Silicon (Si), Germanium (Ge), Gallium arsenide (GaAs), for example, using various design technologies, such as complementary metal-oxide semiconductor (CMOS), Silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other materials and technologies known to those in the art.

In at least one embodiment, the fixed amplifier input stage 812 may include a fixed amplifier implemented on a GaAs ED-pHEMT die, the adjustable attenuator 814 may include a digital switched attenuator (DSA) implemented on an SOI die, the variable gain amplifier 816 may include an adjustable gain amplifier implemented on a BCD-LDMOS die, and the controller 820 may be implemented on a bulk CMOS die. Each of the dies may be mounted upon or coupled to a substrate with interconnections to each other within the substrate, or by other conducting materials, to convey signals between the various inputs, outputs, and controlled elements of each die, and the set of dies on the substrate may be packaged into a multi-chip module (MCM) with a physical format suitable for incorporation into a device, such as a cable modem, by, for example, mounting and/or soldering to a circuit board.

Figure 5:
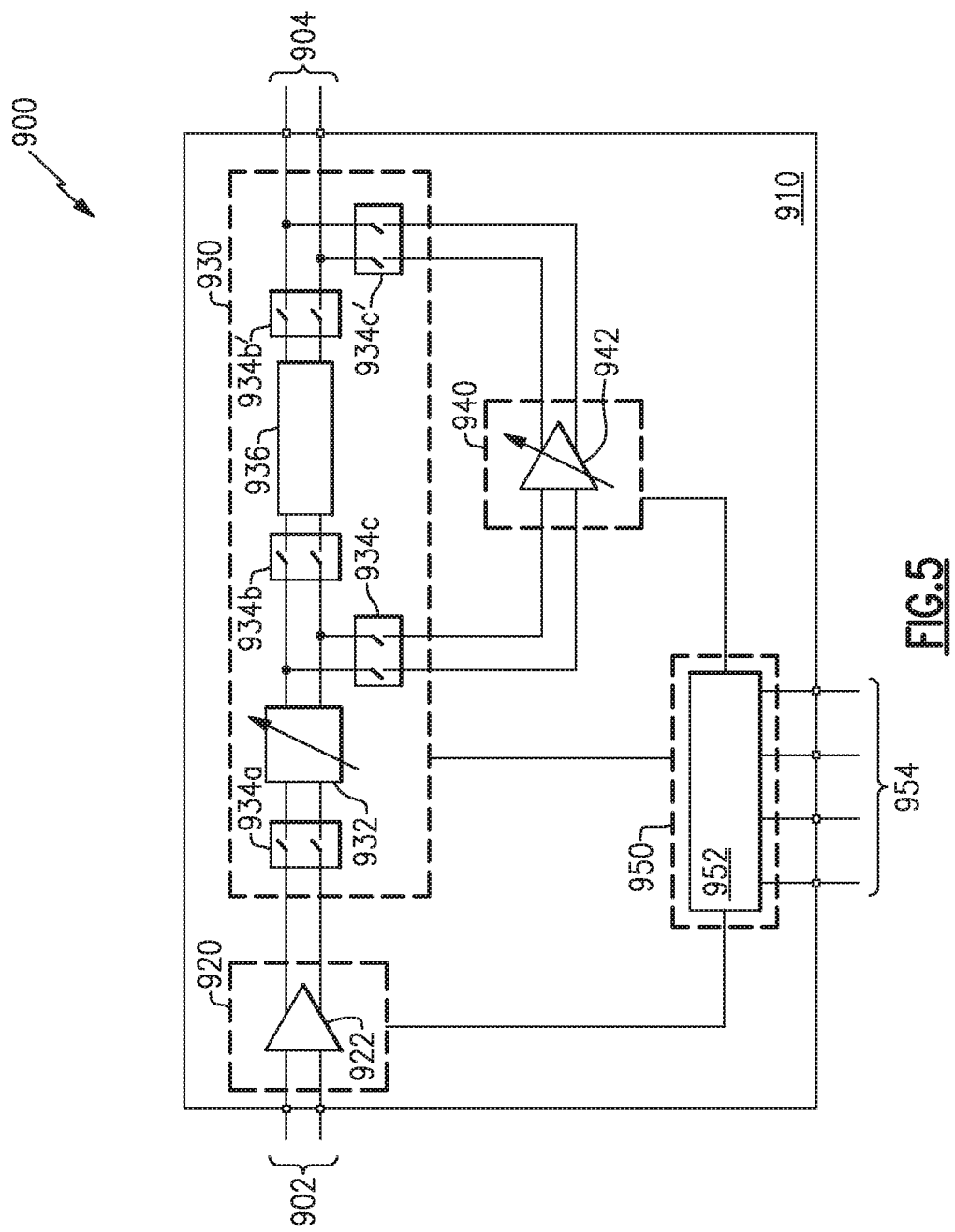
FIG. 5 is a block diagram illustrating an example of an amplifier system implemented as a multi-chip module according to certain aspects.

FIG. 5 illustrates an example of an amplifier system 900 implemented as a multi-chip module. The amplifier system 900 can be used as the amplifier system 810 of FIG. 4, for example. The amplifier system 900 has an input 902 for receiving balanced differential transmit signals and an output 904 for providing amplified balanced differential transmit signals. The amplifier system 900 includes multiple chip dies, as described individually in more detail below, provided on a substrate 910. A first die 920 is coupled to the input 902 and includes a fixed gain amplifier 922, such as a low noise amplifier that may correspond to the fixed amplifier input stage 812 described above with respect to FIG. 4. A second die 930 is coupled to the output of the fixed gain amplifier 922 and includes an adjustable digital switched attenuator 932 and a set of switches 934 that selectively route the transmit signal from the output of the digital switched attenuator 932 to either of a fixed attenuator 936, e.g., a loss pad, in a bypass mode, or to a third die 940 that includes a variable gain amplifier 942, in an amplify mode. The adjustable digital switched attenuator 932 may correspond to the adjustable attenuator 814, and the variable gain amplifier 942 may correspond to the variable gain amplifier 816, each described above with respect to FIG. 4. The output of the second die 930 is coupled to the output 904. Portions of the second die 930 and the third die 940 together may form an output stage that may be in bypass mode or in amplify mode based upon the status of the switches 934.

The switches 934 may be multiple switches as shown or may be fewer switches implemented with, e.g., single-pole double-throw switches that alternately make a connection to one or another signal path. In some embodiments, some of the switches 934 may be configured to enable a signal path upon receiving a particular control signal and others of the switches 934 may be configured to disable a signal path upon receiving a similar control signal. In some embodiments, inverters may be provided such that a single control signal may cause some of the switches 934 to enable a signal path and cause others of the switches 934 to disable a signal path. The switches 934 may be implemented as transistors or any suitable technology.

The amplifier system 900 also includes a fourth die 950 that includes a controller 952 that provides control signals to components included on one or more of the first, second, and third dies. The controller 952 may correspond with the controller 820 described above with respect to FIG. 4. For example, the controller 952 may communicate with or control the attenuation settings of the digital switched attenuator 932, control the gain settings of the variable gain amplifier 942, and control the switches 934 to place the output stage in bypass mode or amplify mode and to establish the overall net gain of the amplifier system 900. The controller 952 may control the various components based upon instructions it receives via a control interface 954.

Figure 6:
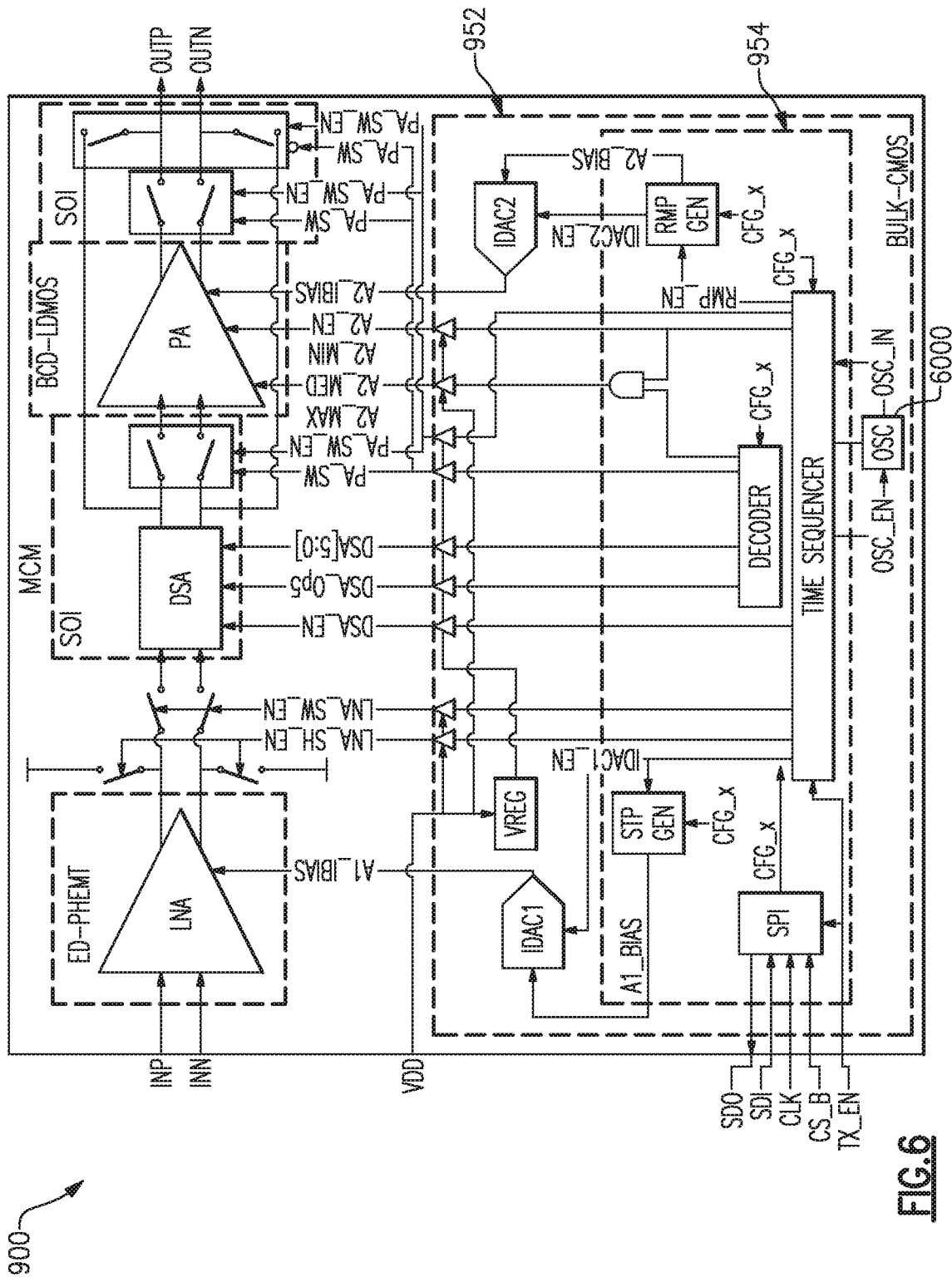
FIG. 6 is a block diagram illustrating another example of an amplifier system implemented as a multi-chip module in accord with certain aspects.

FIG. 6 is a block diagram depicting an example of the amplifier system 900 implemented as a multi-chip module. For example, the amplifier system 900 may correspond to the amplifier system 900 described above with respect to FIG. 5 or the amplifier system 810 described above with respect to FIG. 4. As shown in FIG. 6, the amplifier system 900 includes a controller 952 that provides various control functions for the amplifier system. Further examples of an amplifier system including a controller are described in the co-pending applications identified above in the CROSS-REFERENCE TO RELATED APPLICATION(S). As shown in FIG. 6, the controller 952 includes an oscillator 6000 that is configured to provide an oscillating signal for use as a digital clock signal for the controller 952 of the amplifier system 900. In some embodiments, the oscillator 6000 is a differential RC (resistive-capacitive) relaxation oscillator, as discussed above.

The oscillator 6000 may provide a reference clock signal allowing the controller 952 to control the timing of changes applied to various components within the amplifier system 900. For example, in response to a request to power up, power down, or make a state change to an amplifier, the oscillator clock signal may be enabled and provided to a counter (e.g. a sequencer or time sequencer) that keeps track of the passage of time. The counter can output a signal indicative of the passage of time and provide the signal to a ramp calculator (referred to in FIG. 6 as a ramp generator). The ramp calculator calculates signal levels to be provided to bias circuitry, such as a current digital to analog converter (IDAC), which provides the appropriate biasing signals to an amplifier in accordance with a desired number of steps, a total amount of time to ramp, and the initial and final signal levels (as determined by the controller given certain pre-programmed signal thresholds and the type of request received). The oscillator clock signal may be disabled at other times, such as during transmission, to avoid interference between the oscillator clock signal (or its harmonics) and the transmitted signal. Examples of using an oscillator signal to control timing during a state change within an amplifier are further described in the co-pending applications identified above in the CROSS-REFERENCE TO RELATED APPLICATION(S).

Figure 7:
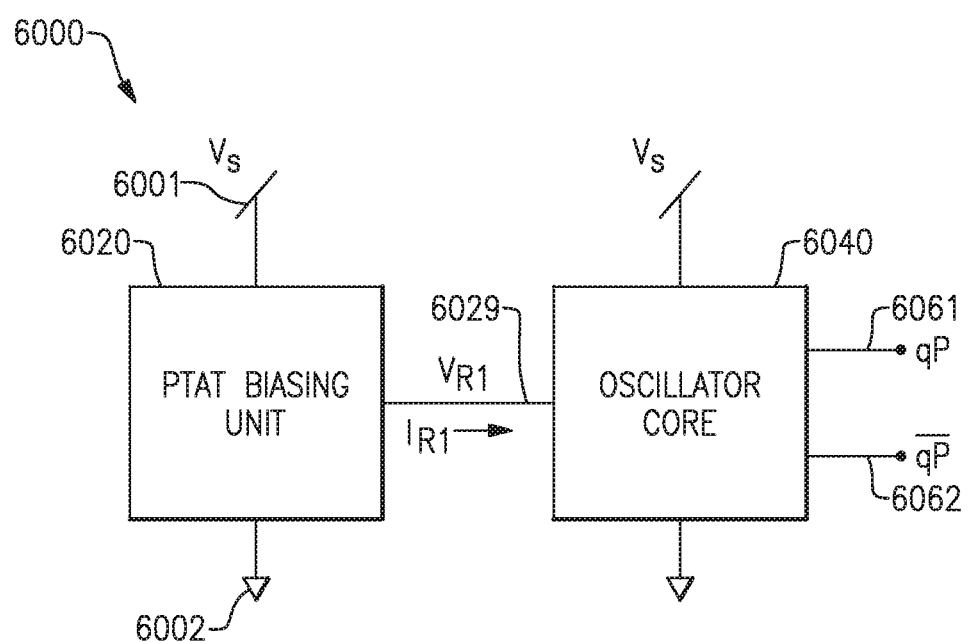
FIG. 7 is a block diagram of one example of a differential RC relaxation oscillator according to certain aspects.

FIG. 7 is a block diagram illustrating one embodiment of a differential RC relaxation oscillator 6000. The oscillator 6000 includes a proportional to absolute temperature (PTAT) biasing unit 6020 coupled to and driven by a supply voltage ($V_S$) at node 6001 and further coupled to a ground node 6002. The PTAT biasing unit 6020 is configured to generate an output reference voltage $V_{R1}$ at an output node 6029 or generate an output reference current $I_{R1}$ through the output node 6029. The output reference voltage $V_{R1}$ or output reference current $I_{R1}$ may each be configured to have a reduced dependence on temperature such that $V_{R1}$ or $I_{R1}$, respectively, each remain relatively constant responsive to changes in temperature within a certain temperature range, as discussed further below.

The oscillator 6000 further includes an oscillator core 6040 coupled to the output node 6029 of the PTAT biasing unit 6020. The oscillator core 6040 is configured to receive $V_{R1}$ or $I_{R1}$ and responsively produce at node 6061 an output signal qp that oscillates back and forth between a maximum voltage and a minimum voltage at a certain frequency. A signal $\overline{qp}$ produced at node 6062 also oscillates similarly to the signal qp, but is substantially 180° out of phase relative to the signal qp. In one embodiment, the signals qp and $\overline{qp}$ are smooth or pseudo-sinusoidal and have a fundamental frequency in the range of 3 MHz to 5 MHz. In another embodiment, the signals qp and $\overline{qp}$ have a fundamental frequency in the range of 0.1 MHz to 1000 MHz. However, in other embodiments oscillating signals qp and $\overline{qp}$ may each be configured to possess other waveform shapes, frequency characteristics, or other AC wave parameters as may be appreciated by those skilled in the art.

The reduced temperature dependence of the PTAT output ($V_{R1}$ or $I_{R1}$) results in a more stable signal over a range of different temperature conditions. For example, in some embodiments, the magnitude of the PTAT output signal can be kept substantially constant over a temperature range of 0 to 120 degrees Celsius. The PTAT output signal affects the fundamental frequency of the oscillator outputs (qp and $\overline{qp}$) since the reference signal ($V_{R1}$ or $I_{R1}$) is provided to the oscillator core 6040 as a biasing signal. Accordingly, by maintaining the PTAT output signal at a substantially constant value over a range of temperatures, the oscillator output frequency may also be maintained at a substantially constant value over the same temperature range.

Figure 8:
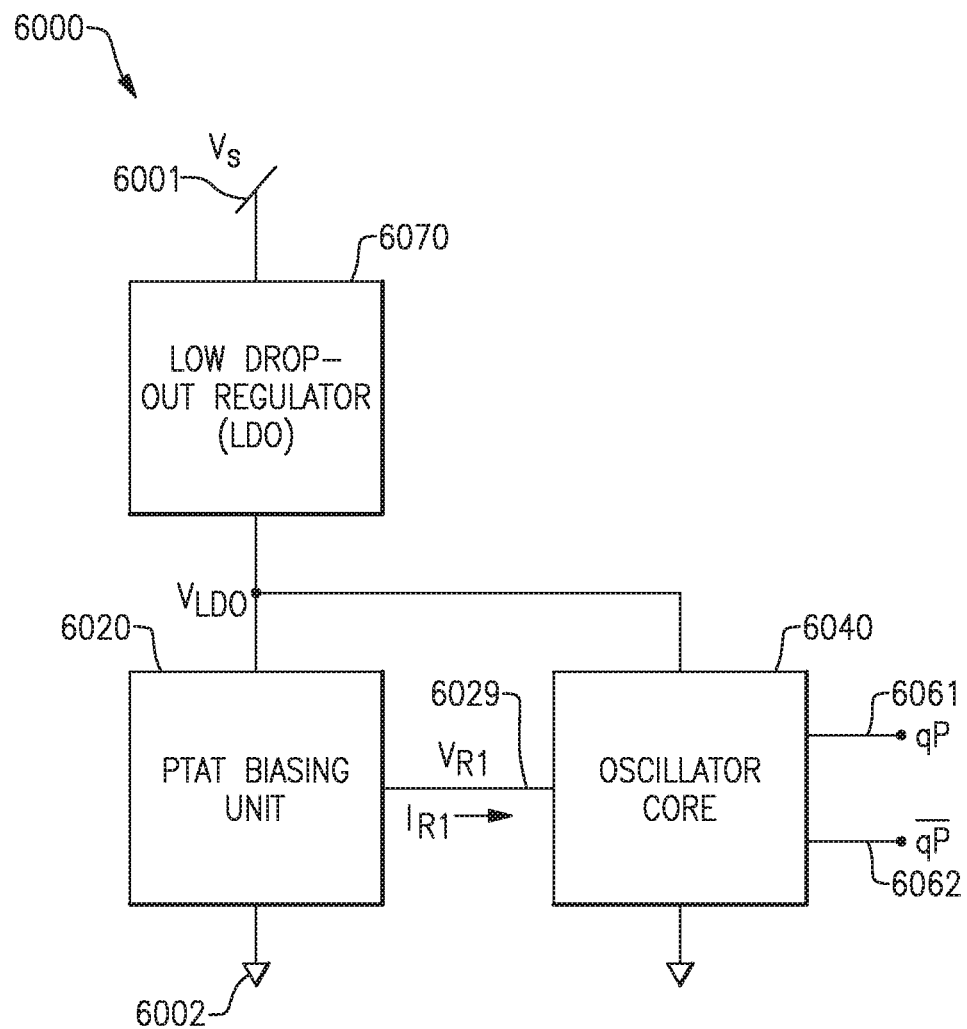
FIG. 8 is a block diagram of another example of a differential RC relaxation oscillator including a low drop-out regulator according to certain aspects.

FIG. 8 is a block-diagram of another embodiment of a differential RC relaxation oscillator 6000. The embodiment of RC oscillator 6000 shown in FIG. 8 functions similarly to the embodiment shown in FIG. 7, except for the addition of a low drop-out regulator (LDO) 6070 that receives the supply voltage at node 6001 and provides a regulated output voltage ($V_{LDO}$) 6004. The LDO 6070 is coupled to and provides the regulated voltage 6004 to the PTAT biasing unit 6020, the oscillator core 6040, and/or any other system components requiring a stable voltage supply in the range of $V_{LDO}$ 6004. The regulated voltage 6004 may, for example, provide a more stable supply voltage relative to conventional supply voltage $V_s$ due to the presence of LDO 6070.

Although the LDO 6070 can help stabilize the voltage being provided to the PTAT biasing unit 6020 and oscillator core 6040—thus helping to improve the frequency stability of the oscillator output—the addition of LDO 6070 is optional especially in applications where chip or die area is limited or where oscillator stability is already within acceptable margins. In some embodiments, the LDO 6070 may be implemented on the same chip as the remaining oscillator 6000 components, while in other embodiments the LDO 6070 may be fabricated onto a separate chip (or chips) coupled to the one or more chips containing the remaining oscillator 6000 components. The LDO 6070 may be fabricated using any combination of the IC materials and processes discussed above with respect to FIG. 4

Figure 9:
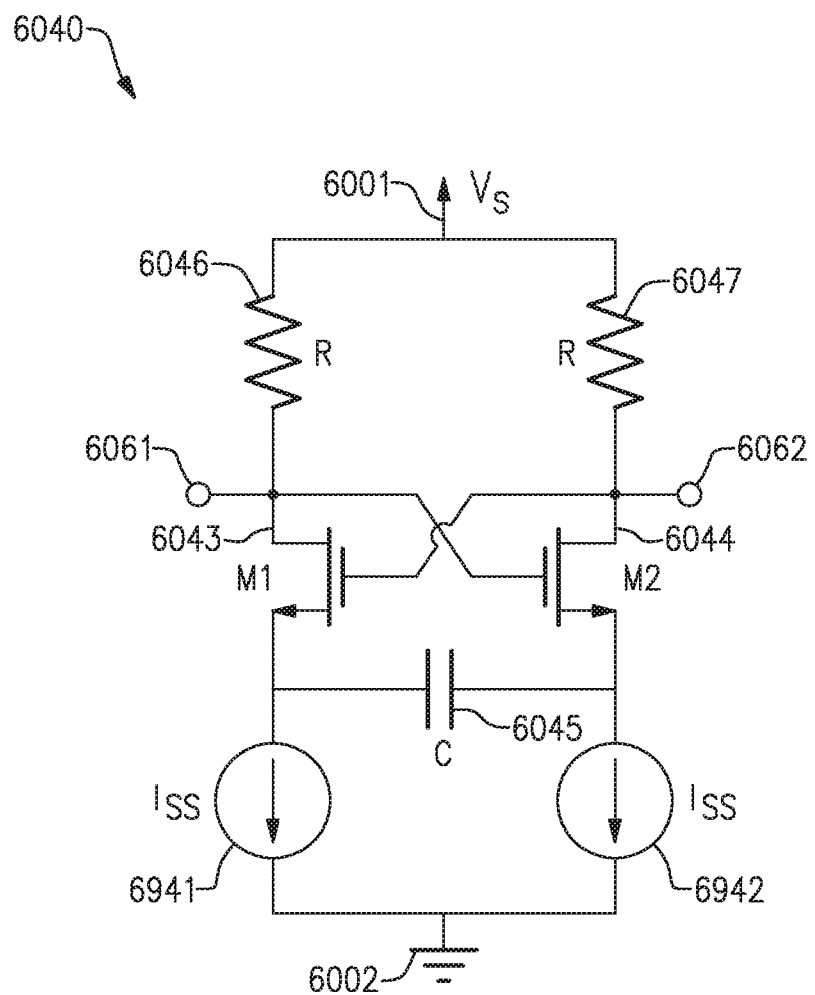
FIG. 9 is a schematic diagram of an example of a differential RC relaxation oscillator core.

As discussed above, the oscillator core 6040 can be implemented as a differential RC relaxation oscillator. FIG. 9 is a simplified schematic diagram depicting one embodiment of a differential RC relaxation oscillator core 6040. A left branch is coupled to the supply voltage $V_s$ at node 6001 and the ground 6002, and includes a first resistor 6046, a first MOSFET 6043, and a first current source 6941. A right branch is coupled to the supply voltage $V_s$ and the ground 6002, and includes a second resistor 6047, a second MOSFET 6044, and a second current source 6942. The gate of the first MOSFET 6043 is coupled to the second branch between the second resistor 6047 and the second MOSFET 6044. The gate of the second MOSFET 6044 is coupled to the first branch between the first resistor 6046 and the first MOSFET 6043. A capacitor 6045 connects the first branch, between the first MOSFET 6043 and the first current source 6941, to the second branch, between the second MOSFET 6044 and the second current source 6942.

Depending on the initial state of the oscillator core 6040, the first current source 6941 or the second current source 6942 causes either the first MOSFET 6043 or the second MOSFET 6044 to turn on, respectively. Assuming the first MOSFET 6043 turns on first, a current $I_{SS}$ is drawn through the first branch causing a charge to accumulate at a first node of the capacitor 6045 and causing an opposite charge to accumulate at a second node of the capacitor 6045, the second node being opposite the first node. When sufficient charge builds up on the second node of capacitor 6045, the second MOSFET 6044 is able to turn on causing the current $I_{SS}$ to be drawn through the second branch. As current is drawn through the second branch, the voltage between the second MOSFET 6044 and the second resistor 6047 drops causing the gate voltage of the first MOSFET 6043 to drop in response and turn off the first MOSFET 6043. Charge begins accumulating at the second node of the capacitor 6045 and an opposite charge begins accumulating at the first node of the capacitor 6045. When sufficient charge builds up on the first node of capacitor 6045, the first MOSFET 6043 is able to turn on again, causing the current $I_{SS}$ to be drawn through the first branch once more. As current is drawn through the first branch, the voltage between the first MOSFET 6043 and the first resistor 6046 drops causing the gate voltage of the second MOSFET 6044 to drop in response and turn off the second MOSFET 6044 again. The process repeats itself causing the voltages at nodes 6061 and 6062 to oscillate back-and-forth in a complementary fashion at a certain fundamental frequency.

Figure 10:
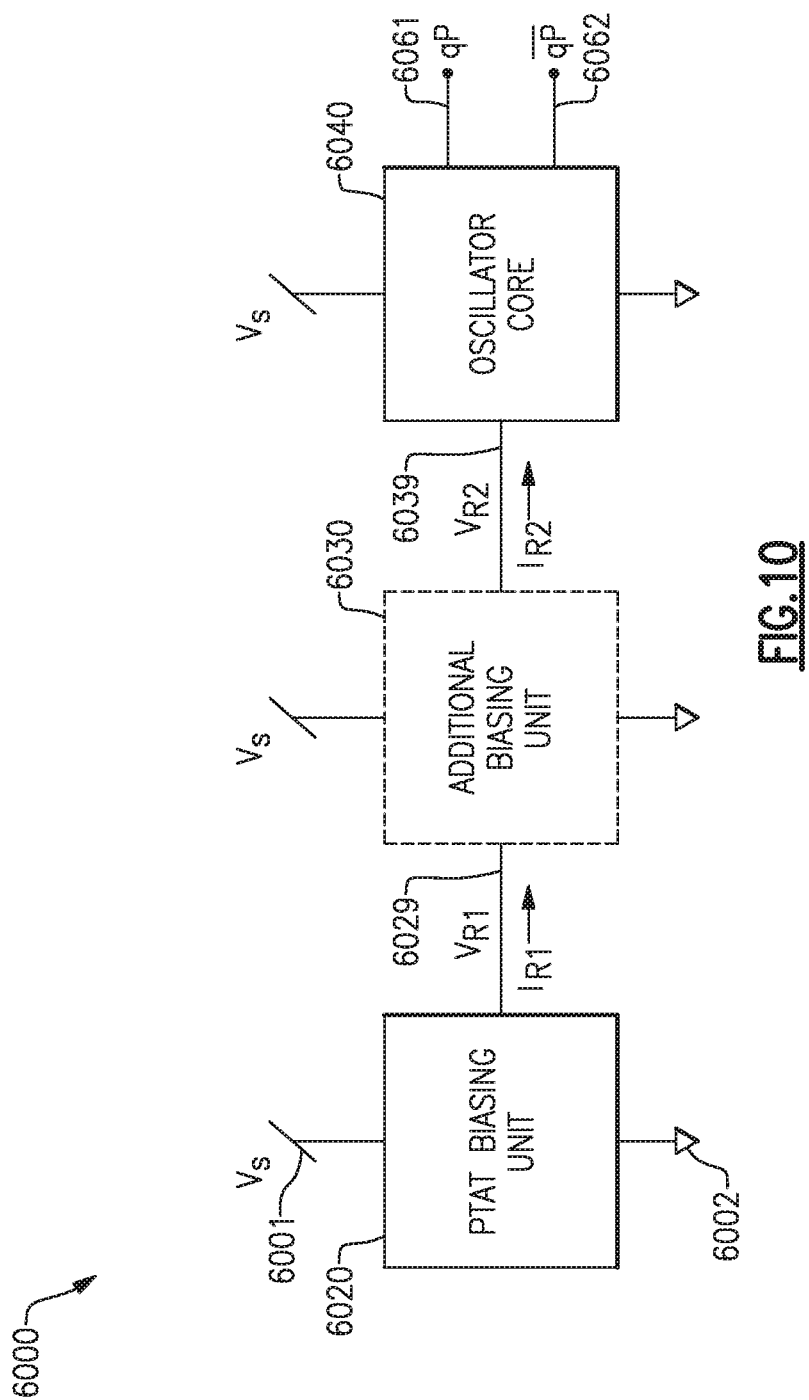
FIG. 10 is a block diagram of another example of a differential RC relaxation oscillator according to certain aspects.

FIG. 10 is a block diagram depicting another embodiment of the differential RC relaxation oscillator 6000. The oscillator 6000 is similar to the embodiment depicted in FIG. 7, but includes an additional biasing unit 6030 coupled to the output node 6029 of the PTAT biasing unit 6020 and configured to receive $V_{R1}$ or $I_{R1}$. The additional biasing unit 6030 is configured to produce an output reference voltage $V_{R2}$ at an output node 6039 and/or generate an output reference current $I_{R2}$ drawn through the output node 6039 in response to receiving $V_{R1}$ or $I_{R1}$. In some embodiments, the additional biasing unit 6030 includes a transistor having a gate biased by $V_{R1}$ to produce a drain current $I_{R2}$. The transistor may be coupled to one or more current mirrors (which may also each be transistor-based) configured to mirror the current $I_{R2}$ and produce a reference voltage $V_{R2}$ at the output node 6039 of the additional biasing unit 6030. The transistors used in the biasing unit 6030 may be MOSFETs, BJTs, or other transistors known to those skilled in the art.

In some embodiments, the inclusion of the additional biasing unit 6030 provides the oscillator core 6040 with an input reference signal ($V_{R2}$ or $I_{R2}$) more quickly and stably relative to the input reference signal that would otherwise be provided directly from the PTAT biasing unit 6020 ($V_{R1}$ or $I_{R1}$) to the oscillator core 6040 without the presence of additional biasing circuitry 6030.

In the example shown in FIG. 10, the oscillator core 6040 is coupled to the output node 6039 of the additional biasing unit 6030. As discussed above, in some embodiments, the oscillator core 6040 is instead coupled directly to the output node 6029 of the PTAT biasing unit 6020 if no additional biasing circuitry 6030 is being used, as shown in FIGS. 7 and 8, for example. The oscillator core 6040 is configured to receive $V_{R2}$ or $I_{R2}$ (or $V_{R1}$ or $I_{R1}$ if no additional biasing circuitry 6030 is used) and responsively cause the output signal qp at node 6061 to oscillate back and forth between a maximum voltage and a minimum voltage at a certain frequency. Signal $\overline{qp}$ at node 6062 also oscillates similarly to the signal qp, but is substantially 180° out of phase relative to signal qp, as discussed above.

Figure 11:
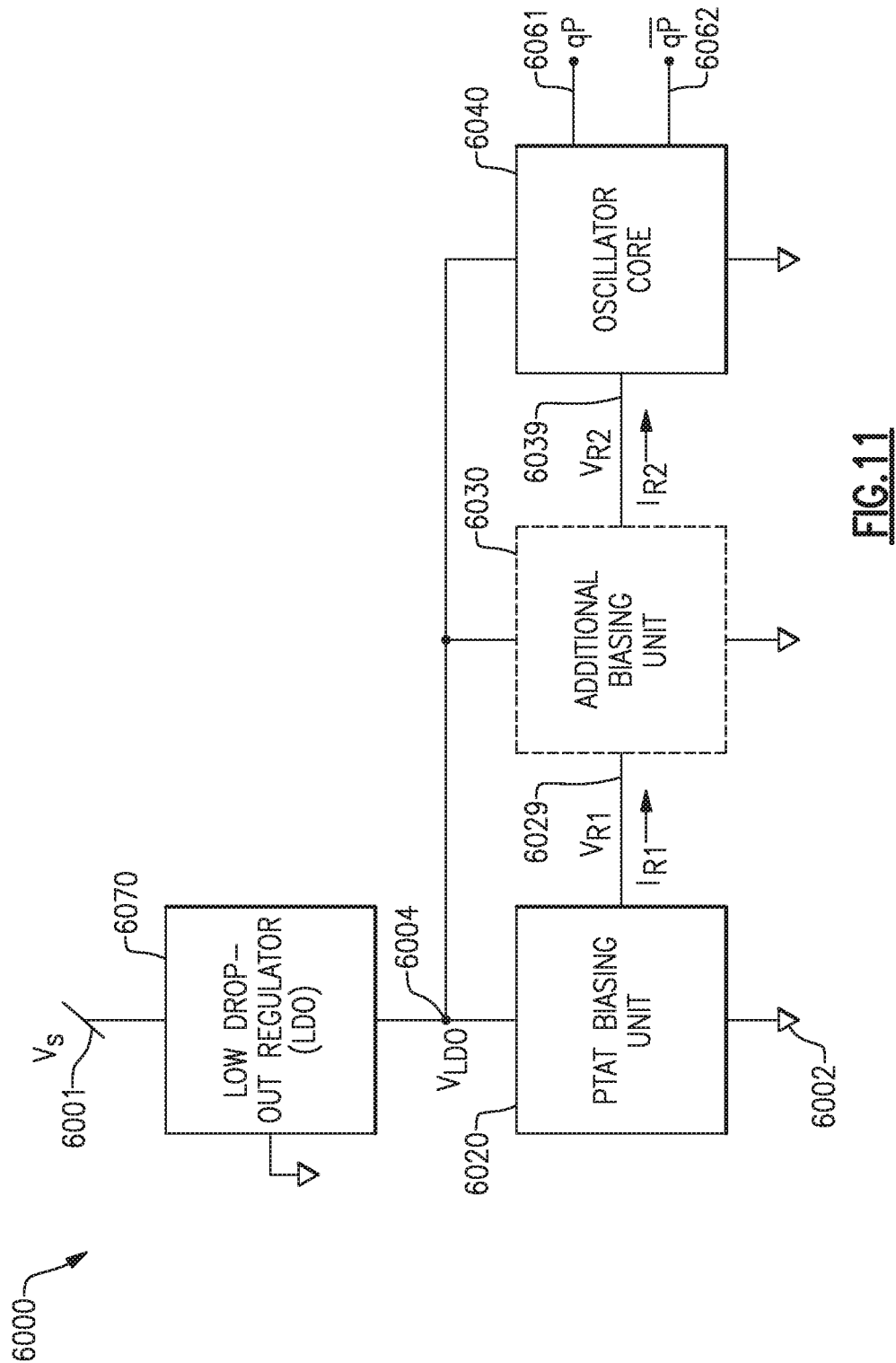
FIG. 11 is a block diagram of another example of a differential RC relaxation oscillator including a low drop-out regulator in accord with certain aspects.

FIG. 11 is a block diagram showing an example of the differential RC relaxation oscillator 6000 of FIG. 10 further including the LDO 6070. This embodiment of the RC oscillator 6000 functions similarly to the embodiment disclosed in FIG. 10, except that the LDO 6070 receives the supply voltage $V_s$ and outputs the regulated voltage ($V_{LDO}$) 6004, which is supplied to the PTAT biasing unit 6020, the additional biasing unit 6030, and the oscillator core 6040.

Figure 12:
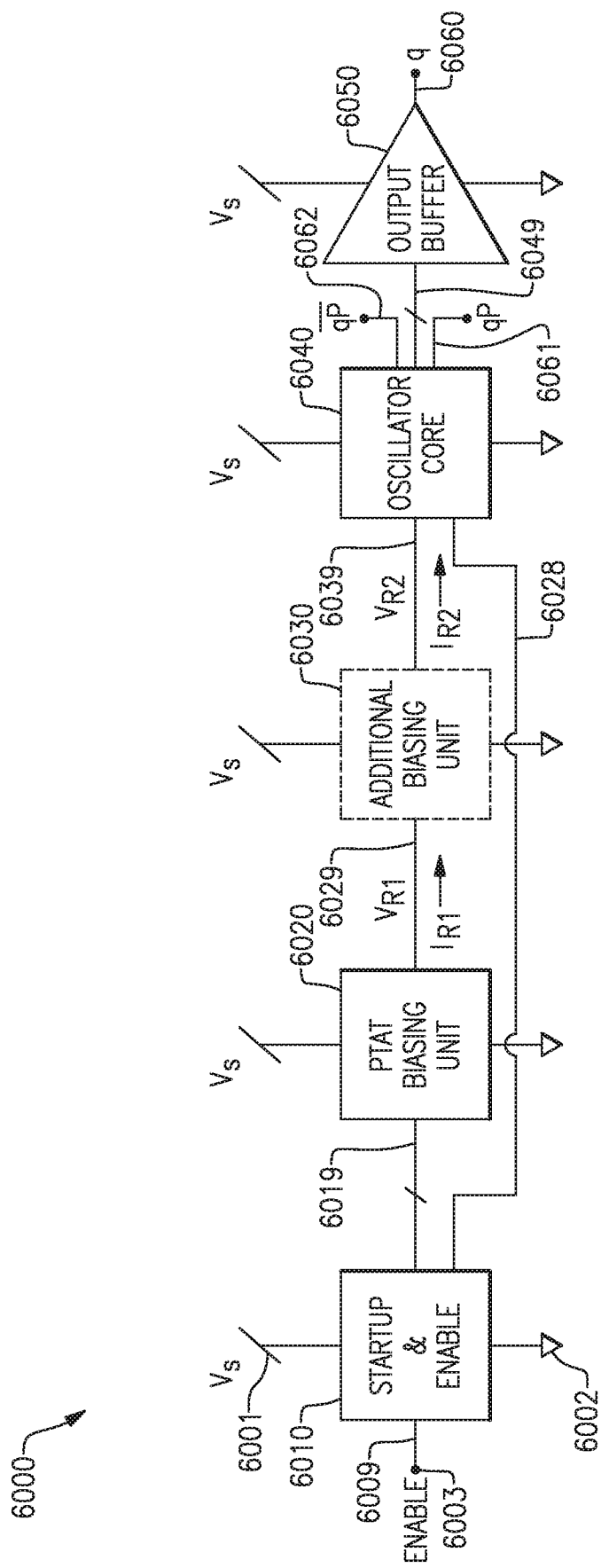
FIG. 12 is a block diagram of another example of a differential RC relaxation oscillator according to certain aspects.

FIG. 12 is a block diagram showing an embodiment of the differential RC relaxation oscillator 6000 including additional circuitry as discussed below. In this example, the oscillator 6000 further includes a startup and enable system 6010 configured to bias the PTAT biasing unit 6020 into a steady state and control operation of the oscillator core 6040 between an active mode and a sleep mode.

The startup and enable system 6010 is coupled to the PTAT biasing unit 6020 via a signal line/bus 6019, and is further coupled to the oscillator core 6040 via a signal line 6028. The startup and enable system 6010 is coupled to and driven by the supply voltage ($V_s$) at node 6001 and coupled to the ground 6002. In one embodiment, the supply voltage $V_s$ varies between 3 and 3.6 volts. In another embodiment, the supply voltage $V_s$ varies between 0.1 V and 20 V. It is to be appreciated by those skilled in the art that other supply voltages outside of this range may be used in certain configurations.

The startup portion of the startup and enable system 6010 provides a constant output bias signal via signal line/bus 6019 to bias the PTAT biasing unit 6020. The PTAT biasing unit 6020 is biased by the startup and enable system 6010 causing the PTAT biasing unit 6020 or additional biasing unit 6030 to produce the corresponding output signal $V_{R1}/I_{R1}$ or $V_{R2}/I_{R2}$, depending on the biasing configuration being used. Accordingly, the startup portion of the startup and enable system 6010 ensures that the reference signal biasing the oscillator core ($V_{R1}/I_{R1}$ or $V_{R2}/I_{R2}$ depending on the configuration) has reached a steady state and is ready to be provided to the oscillator core 6040 as soon as one or more conduction paths are enabled by the enable portion of the startup and enable system 6010.

As discussed above, in various embodiments of the RC oscillator 6000, the oscillator core 6040 is operable in both an active mode and a sleep mode, and is configured to quickly switch between the sleep mode and the active mode as follows. To transition the oscillator core 6040 from the sleep mode to the active mode, the enable portion of the startup and enable system 6010 receives an enable signal 6003 input along signal line 6009. The enable signal is provided by a separate system or component such as an amplifier controller described above with respect to FIGS. 4-6.

Figure 16A:
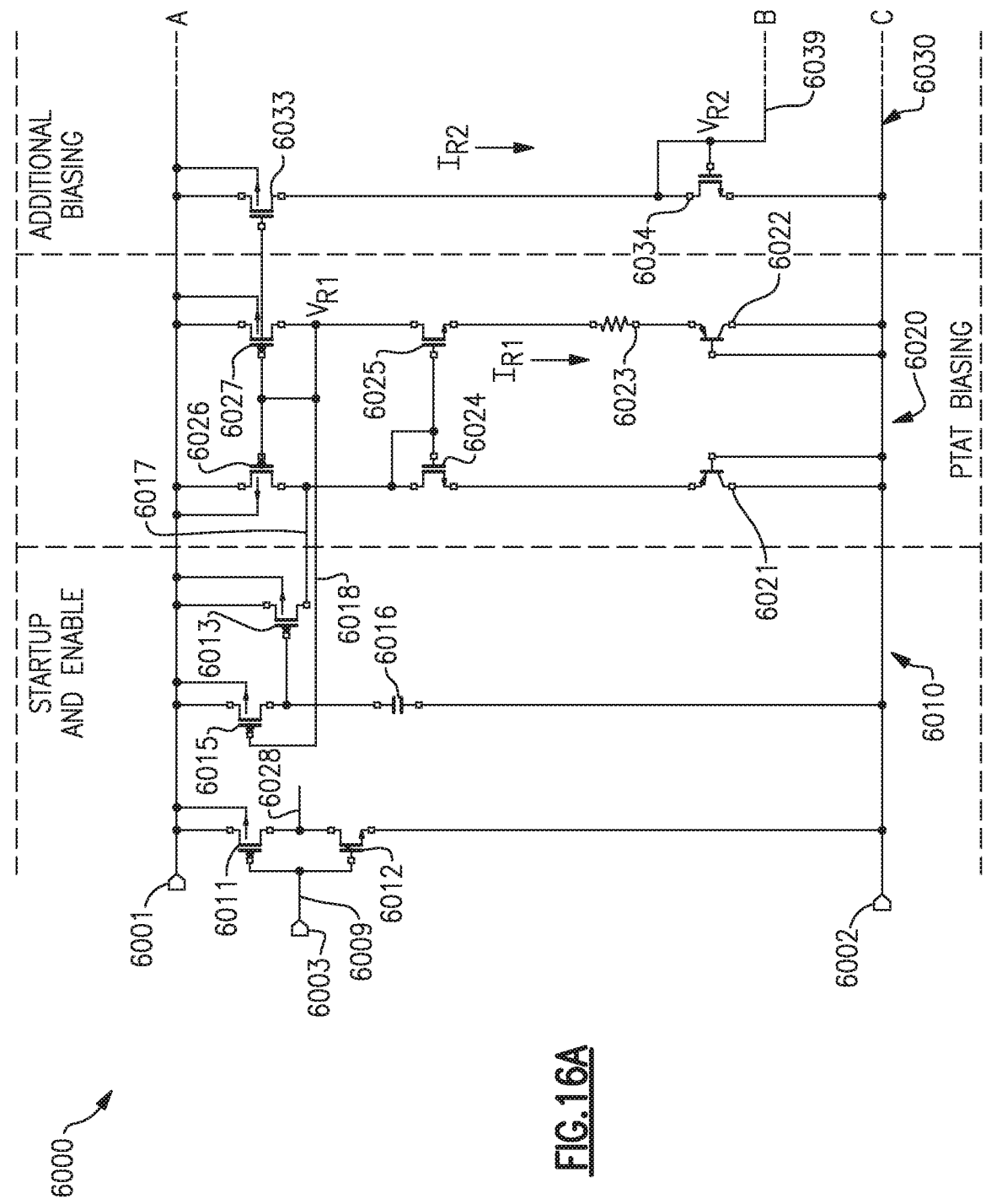
FIG. 16A is a partial schematic view of the differential RC relaxation oscillator of FIG. 12.
Figure 16B:
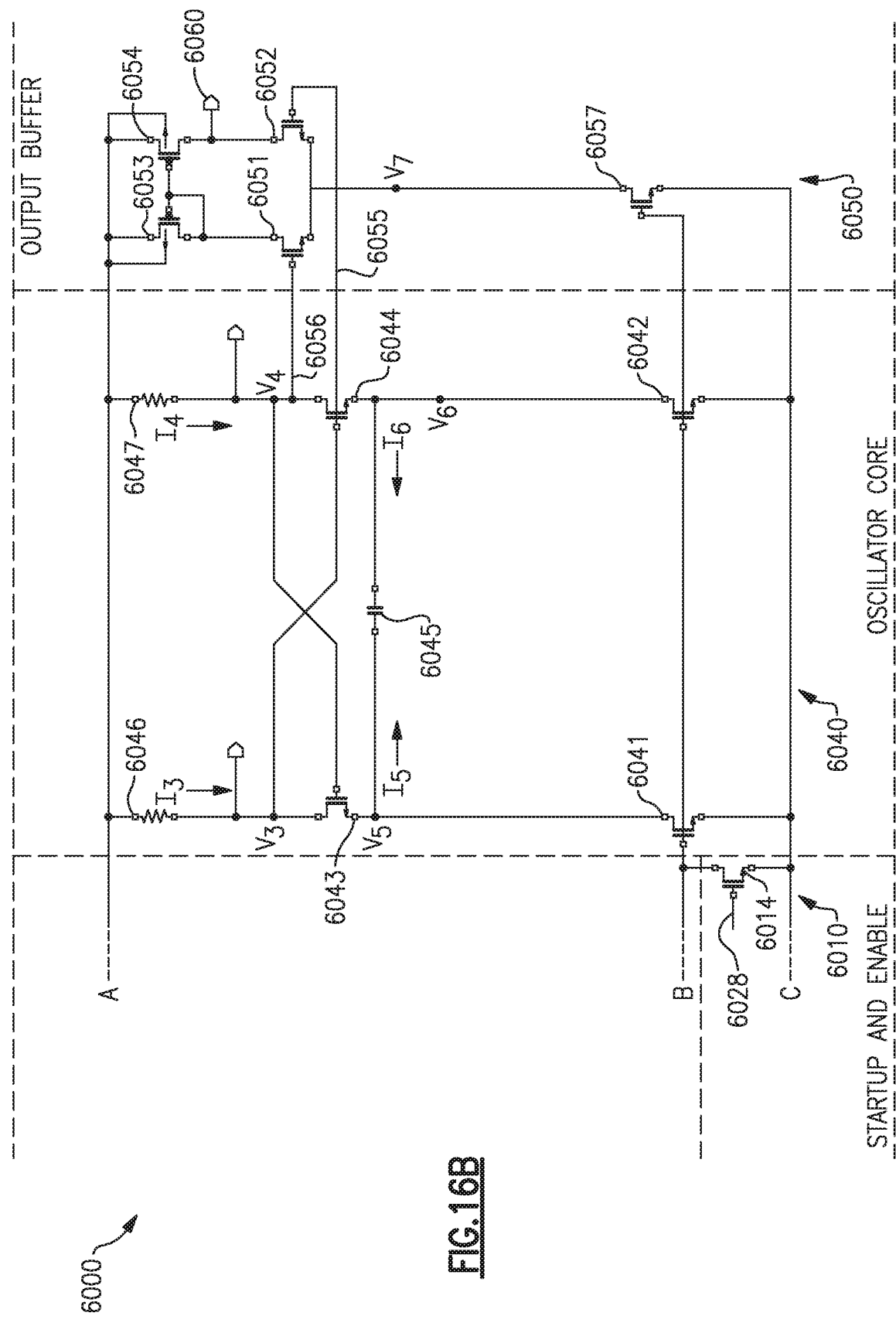
FIG. 16B is a partial schematic view of the remaining topology of the RC relaxation oscillator depicted in FIG. 16A.

In the exemplary embodiment described herein, the enable signal is active low, such that when the enable signal is asserted, it is at a logic low level, and corresponds to the active mode of the oscillator core 6040. When the enable signal is deasserted, it is at a logic high level, and corresponds to the sleep mode of the oscillator core. Enable circuitry within the startup and enable system 6010 (such as an enable transistor 6014 as shown in FIGS. 16A-16B) is arranged to shunt the biasing signal $V_{R2}$ or $I_{R2}$ from the signal line 6039 (or alternatively to shunt biasing signal $V_{R1}$ or $I_{R1}$ from signal line 6029 if no additional biasing circuitry 6030 is being used) to ground 6002 in response to the enable signal not being asserted (e.g. logic high). By shorting the biasing signal to ground 6002, the biasing signal is not provided to the oscillator core 6040 causing the oscillator core 6040 to remain inactive. Accordingly, when the enable signal 6003 is asserted, the enable circuitry ceases shunting the biasing signal ($V_{R1}/I_{R1}$ or $V_{R2}/I_{R2}$ depending on the configuration being used) allowing the biasing signal to couple to the oscillator core 6040 via signal line/bus 6039 (or via signal line/bus 6029 if no additional biasing unit 6030 is being used). As described above, once the biasing signal is fed into the oscillator core 6040, the oscillator core 6040 begins producing the oscillating output signals qp and $\overline{qp}$.

Conversely, the startup and enable system 6010 is also configured to transition the oscillator core 6040 from active mode back to sleep mode. To transition the oscillator core 6040 from the active mode back to the sleep mode, the enable signal 6003 is deasserted, which corresponds to the sleep mode. As discussed above, the enable signal is provided by a separate system or component such as an amplifier controller described above with respect to FIGS. 4-6. Accordingly, when the enable signal 6003 is deasserted, the enable circuitry resumes shunting the biasing signal ($V_{R1}$/$I_{R1}$ or $V_{R2}$/$I_{R2}$ depending on the configuration being used) preventing the biasing signal from coupling to the oscillator core 6040. In response, the oscillator core 6040 ceases producing the oscillating output signals qp and $\overline{qp}$. A more detailed discussion of the transitions from sleep mode to active mode and from active mode to sleep mode are described below with respect to FIGS. 16A and 16B.

In certain embodiments, the startup and enable system 6010 may invert the enable signal to generate an $\overline{enable}$ signal on signal line 6028 and provide the inverted enable signal to the enable circuitry within the startup and enable system 6010. In other embodiments, complementary or non-inverting logic may be used such that the enable signal is fed directly to the gate of an enable transistor instead of the $\overline{enable}$ signal or an alternate type of transistor 6014 is used (for example an NMOS instead of a PMOS). It should be appreciated that the both a "high" enable signal or a "low" enable signal can be set to correspond to the sleep mode depending on whether an inverter is present in the startup and enable system 6010 (e.g. the inverter formed by transistors 6011 and 6012) and the type of transistor 6014 used to couple the signal line 6028 to ground versus the oscillator core 6040.

In still other embodiments, the startup and enable system 6010 may be further configured to similarly disable other signals being passed between oscillator units 6020, 6030, 6040, or 6050 to further prevent the oscillator 6000 from producing an oscillating output signal. For example, the startup and enable system 6010 may include additional transistors (not shown) configured to shunt to ground any or all of the signals being passed between oscillator units 6020, 6030, 6040, or 6050 in response to receiving the appropriate control signal at the gate of said transistor(s).

Still referring to FIG. 12, the PTAT biasing unit 6020 operates as described above with respect to FIG. 7. Further, in certain embodiments the PTAT biasing unit 6020 may be coupled to an additional biasing unit 6030 as described above with respect to FIG. 10. Depending on the embodiment, either the PTAT biasing unit 6020 or the additional biasing unit 6030 is coupled to the oscillator core 6040 as described above with respect to FIG. 7 and FIG. 10.

In certain embodiments, the oscillator 6000 further includes an output buffer 6050 coupled to an output of the oscillator core 6040. One of the oscillating output signals qp, $\overline{qp}$ is coupled to the output buffer 6050 via a signal bus 6049. The output buffer 6050 is also coupled to and driven by the supply voltage ($V_S$) at node 6001 and coupled to the ground 6002. The output buffer 6050 receives the input signal qp or $\overline{qp}$ via the signal bus 6049 and outputs buffered oscillating signal $\overline{q}$ or q, respectively. In one embodiment, the signal q or $\overline{q}$ has a fundamental frequency in the range of 3 MHz to 5 MHz. In another embodiment, the signal q or q has a fundamental frequency in the range of 0.1 MHz to 1000 MHz. However, in other embodiments oscillating signal q or $\overline{q}$ may assume other waveform shapes, frequency characteristics, or other AC wave parameters as may be appreciated by those skilled in the art. The presence of output buffer may, for example, provide an increased output impedance relative to an unbuffered output directly from the oscillator core 6040. Accordingly, the addition output buffer 6050 can increase the stability, noise resistance, or other signal properties of the buffered oscillating signal $\overline{q}$ or q relative to the unbuffered oscillating signals qp and $\overline{qp}$.

In some embodiments, the output buffer 6050 can be configured to "square off" the smooth or pseudo-sinusoidal oscillating signals $\overline{qp}$ and qp, such that the buffered oscillating signal $\overline{q}$ or q has profiles substantially similar to a square wave. This configuration allows for harmonic content of the oscillating signals to be reduced in the oscillator core (due to the smoothness) and subsequently provides for a substantially square-wave signal sufficient for use as a digital clock signal to be output as the buffered oscillating signal. In some embodiments, the output buffer may be a differential output buffer configured to buffer the difference between the two oscillating output signals qp or $\overline{qp}$. In other embodiments, the output buffer 6050 can instead be configured to preserve the smooth or pseudo-sinusoidal nature of the input waveforms by using an integrating capacitor similar to the oscillator core 6040.

Figure 13:
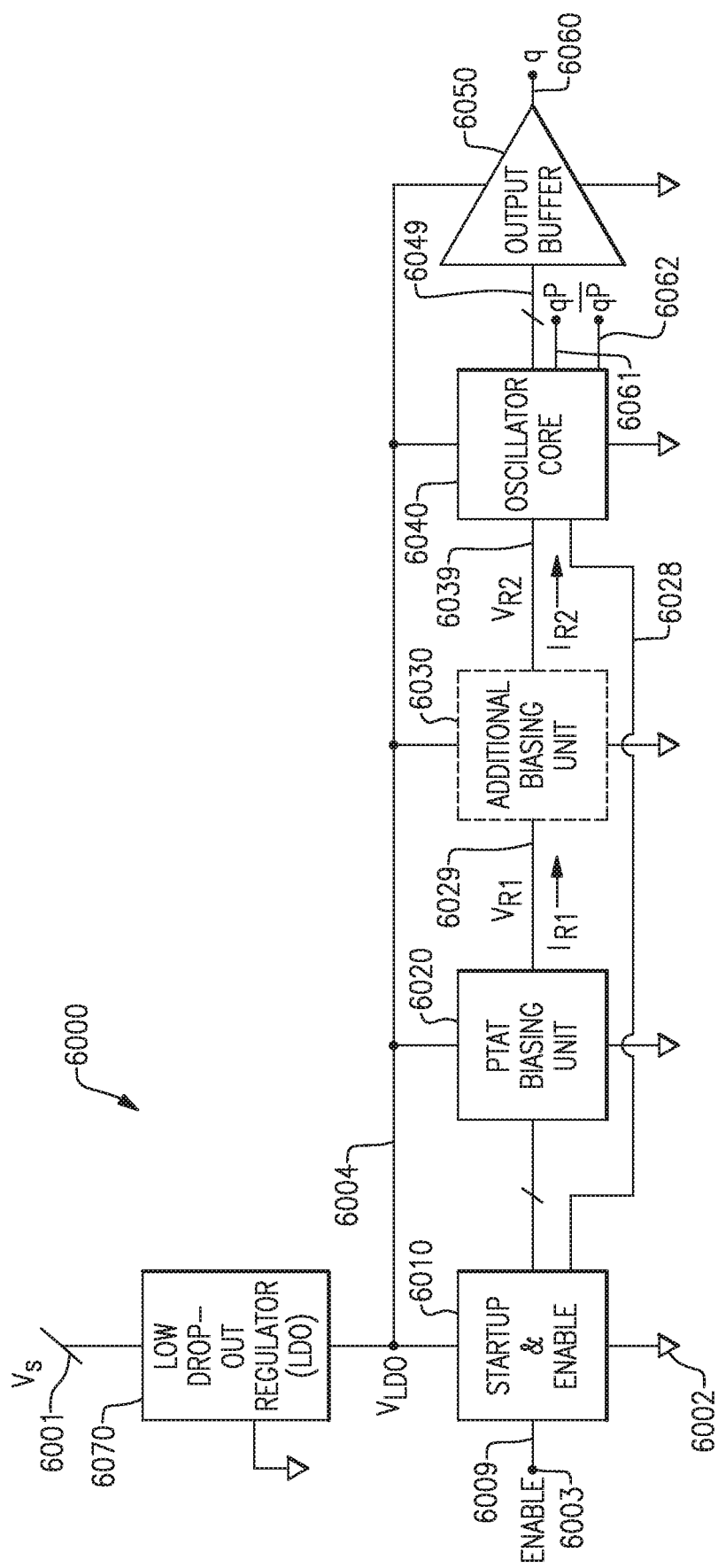
FIG. 13 is a block diagram of another example of a differential RC relaxation oscillator including a low drop-out regulator in accord with certain aspects.

FIG. 13 is a block diagram depicting another embodiment of the differential RC relaxation oscillator 6000. This embodiment of the RC oscillator 6000 functions similarly to the embodiment disclosed in FIG. 12, except for the addition of the low drop-out regulator (LDO) 6070 that receives the supply voltage $V_s$ at node 6001 and outputs the regulated voltage ($V_{LDO}$) 6004, as discussed above. The addition of an LDO 6070 helps stabilize fluctuations in the supply voltage provided to the various systems 6010, 6020, 6030, 6040, and 6050. Variations in the supply voltage provided to the systems 6010, 6020, 6030, 6040, and 6050 can further destabilize the frequency of the signals qp or $\overline{qp}$ output by the oscillator core 6040, which should be kept as constant as possible in order to effectively function as a clock signal.

The LDO 6070 is coupled to and provides the regulated voltage 6004 to each of the startup and enable system 6010, the PTAT biasing unit 6020, the additional biasing circuitry 6030 (if present), the oscillator core 6040, the output buffer 6050, and/or any other system components requiring a stable voltage supply in the range of $V_{LDO}$ 6004.

Figure 14:
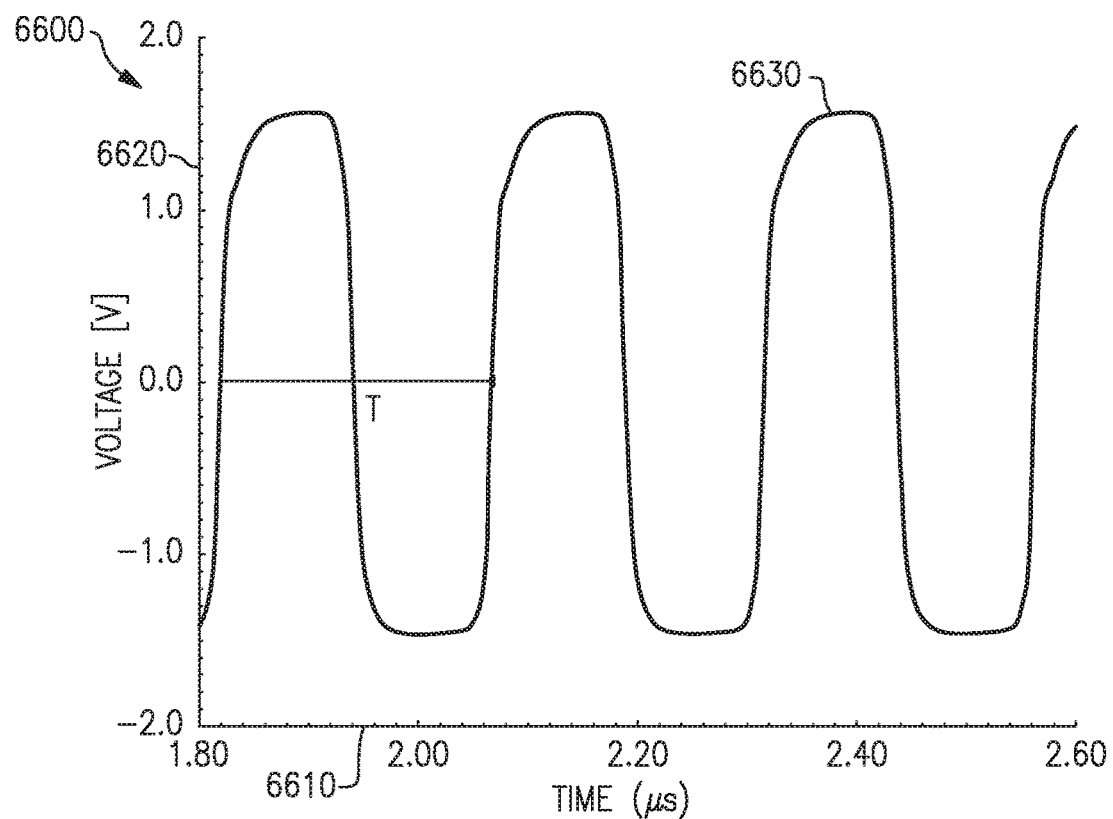
FIG. 14 is a graph depicting an example of an oscillating output signal produced by a differential RC relaxation oscillator according to certain embodiments.

FIG. 14 is a graph 6600 depicting an example oscillating output signal 6630 produced by an embodiment of a differential RC relaxation oscillator disclosed herein. A vertical axis (y) 6620 depicts voltage in volts and a horizontal axis (t) 6610 depicts time in microseconds. The line segment T indicates a single clock cycle or period of the oscillating signal 6630. Assuming that the waveform 6630 has an amplitude A, the integrating response of the capacitor in the oscillator core used to generate this signal smooths the waveform 6630 so that it more closely resembles the idealized sinusoidal waveform $$y(t) = A\sin\left(\frac{2\pi t}{T}\right).$$

Figure 15:
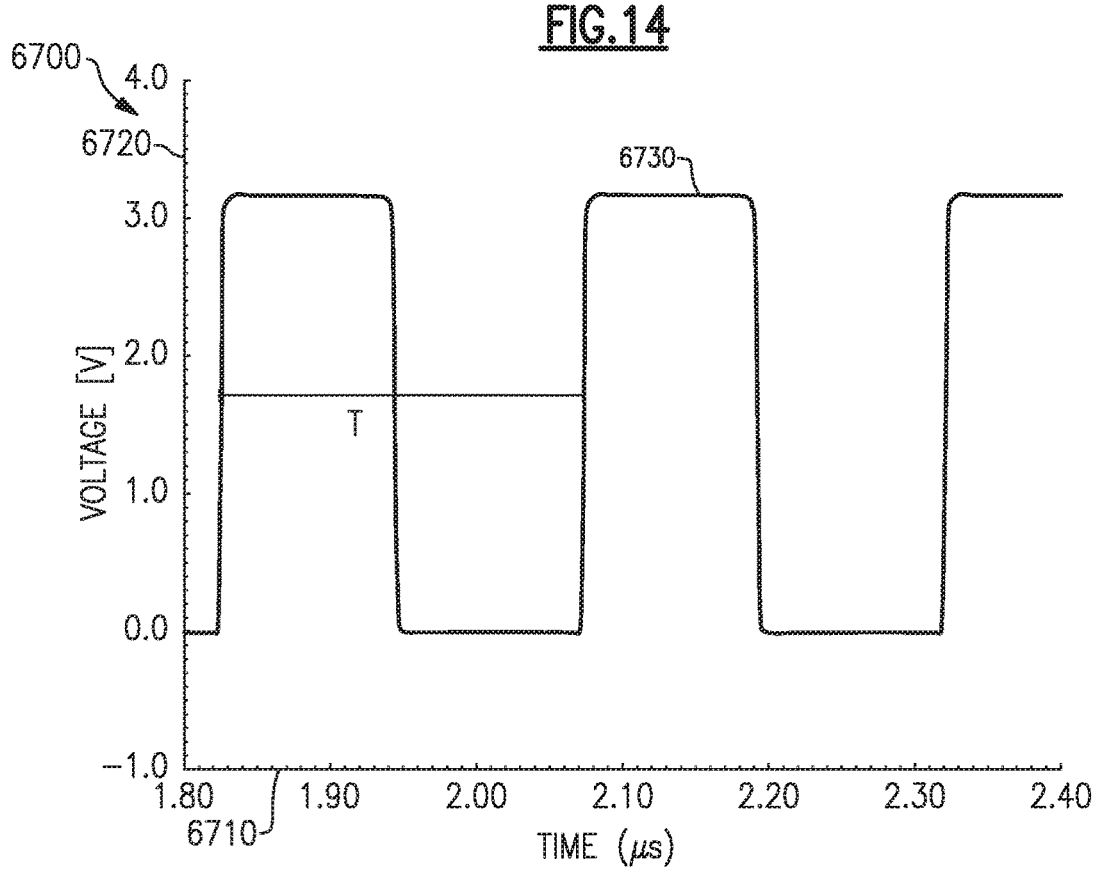
FIG. 15 is a graph depicting an example buffered oscillating output signal produced by the differential RC relaxation oscillator.

FIG. 15 is a graph 6700 depicting an example buffered oscillating output signal 6730 produced by an embodiment of a differential RC relaxation oscillator disclosed herein. A vertical axis (y) 6720 depicts voltage in volts and a horizontal axis (t) 6710 depicts time in microseconds. The line segment T indicates a single clock cycle or period of the oscillating signal 6630. Assuming that the waveform 6730 has an amplitude A, the differential buffering of the output buffer following the oscillator core squares-off the waveform 6730 so that it more closely resembles the idealized square-wave function $y(t) = A \sum_{n=-\infty}^{+\infty} \Pi(t-nT)$, where $\Pi(t)$ represents the rectangular function.

FIGS. 16A and 16B are detailed schematic circuit diagrams depicting an exemplary differential RC relaxation oscillator 6000 in accordance with FIG. 12. FIG. 16A depicts a first portion of the example RC oscillator including a portion of the startup and enable system 6010, the PTAT biasing unit 6020, and the additional biasing unit 6030. The startup transistors 6013 and 6015 are coupled to the supply voltage 6001 and, in response to receiving the supply voltage 6001, bias the PTAT biasing unit 6020 via signal lines/buses 6017 and 6018, respectively. The biasing provided to the PTAT biasing unit 6020 by startup transistors 6013 and 6015 allows the PTAT biasing unit 6020 to output a reference current $I_{R1}$ as is described in further detail below.

As discussed above, the RC oscillator 6000 can transition from the sleep mode to the active mode responsive to the enable signal 6003 being asserted and provided to the startup and enable system 6010 via signal line 6009. A CMOS inverter formed by MOSFETs 6011 and 6012, causes a complementary $\overline{enable}$ signal to be output by the inverter along signal line/bus 6028. As discussed above with respect to FIG. 12, in various embodiments complementary logic may be used (e.g. by omitting the inverter, adding additional inverters, or changing the type or polarity of the transistor 6014) such that the opposite signal values (low vs. high, high vs. low) are asserted to trigger the sleep mode versus the active mode relative to the example shown in FIG. 16.

FIG. 16B depicts a second portion of the example RC oscillator including the remaining portion of the startup and enable system 6010, the oscillator core 6040, and the output buffer 6050. The $\overline{enable}$ signal output by the inverter (shown in FIG. 16A) propagates along signal line/bus 6029 and is coupled to the gate of n-type MOSFET 6014. In the sleep mode, the $\overline{enable}$ signal is logic HIGH and turns on MOSFET 6014 such the transistor shorts signal line 6039 to ground. In the active mode, the $\overline{enable}$ signal is logic LOW and turns off MOSFET 6014 such that MOSFET 6014 behaves as an open circuit. In one embodiment, the transition from sleep mode to active mode takes less than one full clock period. In the example shown in FIGS. 16A and 16B, this transition may take less than 200 ns.

Also shown in FIG. 16A, the PTAT biasing unit 6020 is coupled to the supply voltage ($V_S$) at node 6001. The PTAT biasing unit 6020 is further coupled to the startup and enable system 6010 via lines 6017, 6018 of the signal bus 6019. Referring to the startup portion of the startup and enable system 6010, the metal-oxide semiconductor field-effect transistors (MOSFETs) 6026, 6027 in the PTAT biasing unit 6020 are each turned on responsive to receiving a startup bias signal from the startup and enable system 6010 via a signal bus 6019, the signal bus comprising signal lines 6017 and 6018. Those skilled in the art will appreciate that the startup circuitry including MOSFETS 6013 and 6015, capacitor 6016, and signal lines 6017 and 6018 is not the only way to provide a startup bias to the PTAT biasing unit 6020. Other startup assemblies configured to provide PTAT biasing unit 6020 with a suitable bias current or bias voltage along the branch formed by MOSFETs 6026 and 6024 and the branch formed by MOSFETs 6027 and 6025 may be implemented instead.

Still referring to FIG. 16A, the reference current $I_{R1}$ is drawn from the supply voltage $V_s$, down the right branch of the PTAT biasing unit 6020 passing through the MOSFETs 6027 and 6025, a resistor 6023, and a bipolar junction transistor (BJT) 6022. The reference current $I_{R1}$ varies proportionately with a temperature-dependent coefficient $T_f$. Accordingly, reducing the magnitude of $T_f$ reduces the amount by which current $I_{R1}$ varies with temperature over a certain temperature range. In the embodiment depicted in FIG. 16A, temperature-dependent coefficient $T_f$ is inversely proportional to the resistance of resistor 6023 and is logarithmically proportional to the width to length ratio of MOSFET 6025. Equation 1, shown below, further describes the relationship between the temperature coefficient $T_f$, MOSFET 6025, the resistor 6023, the reference current $I_{R1}$, and the absolute temperature T, for example.

$$T_f = \frac{\sqrt{\frac{I_{R1}}{K_p\left(\frac{W}{L}\right)_{6025}}} * \frac{\partial K_p}{\partial T} + \frac{\partial |V_{tp}|}{\partial T}|V_{tp}| + \sqrt{\frac{I_{R1}}{K_n\left(\frac{W}{L}\right)_{6022}}} * \frac{\partial K_n}{\partial T} + \frac{\partial V_{tn}}{\partial T}V_{tn} - \frac{\partial R}{\partial T}I_{R1}R}{\frac{1}{2}(R*I_{R1}+V_s+|V_{tp}|)} \quad \text{Equation 1}$$

In Equation 1, $$\frac{W}{L}_{6025}$$

refers to the channel width to length ratio of MOSFET 6025, $K_p$ refers to the channel divider factor of MOSFET 6025, R refers to the resistance value of resistor 6023, and $V_{tp}$ refers to the threshold voltage of MOSFET 6025. Parameters $K_n$, $V_{tn}$ and $$\frac{W}{L}_{6022}$$

relate to the BJT transistor 6022 and do not necessarily need to be varied to minimize the temperature dependence since the other parameters discussed above can be controlled more readily. Those having skill in the art will also appreciate, that one or more properties of BJT transistor 6022 may also be configured to affect the temperature coefficient of the present example as shown in Equation 1, and that other sources of current drive besides BJT transistors 6021, 6022 may be used instead.

Accordingly, based on Equation 1, parameters such as the size of the resistor 6023 or the width to length ratio of MOSFET 6025 may be selected such that $T_f$ is minimized or reduced. In some embodiments, $T_f$ may be minimized to the greatest extent possible, while in other embodiments $T_f$ may be reduced by lesser amount in order to sufficiently reduce temperature sensitivity while also satisfying additional design parameters. Those skilled in the art will appreciate that, in other embodiments, alternate temperature-dependent biasing topologies may be used having their own respective temperature-dependent coefficients. The temperature-dependent coefficient in those alternate topologies may be similarly reduced or minimized to reduce the temperature sensitivities of those topologies as well.

Still referring to FIG. 16A, the PTAT biasing unit 6020 outputs a reference voltage $V_{R1}$ at the node between MOSFETs 6026 and 6027. The reference voltage $V_{R1}$ is based on the magnitude of the reference current $I_{R1}$, and is coupled to the additional biasing circuitry 6030 via the signal line 6029. The reference voltage $V_{R1}$ is input on the signal line 6029 and coupled to the gate of MOSFET 6033 within the additional biasing unit 6030. The reference voltage $V_{R1}$ turns on MOSFETs 6033 and 6034 causing a mirrored reference current $I_{R2}$ to be drawn from the supply voltage $V_s$ through MOSFETs 6033 and 6034 and into the oscillator core 6040 via the signal line 6039. As shown, a mirrored reference voltage $V_{R2}$ is set based on the magnitude of mirrored reference current $I_{R2}$ and is used to control the gates of transistors 6041 and 6042 within the oscillator core 6040 via the signal line 6039 as shown in FIG. 16B. In some embodiments, where the additional biasing unit 6030 is not included, the reference voltage $V_{R1}$ may instead be provided directly to the oscillator core via signal line 6039 or to alternate biasing circuitry functioning as an intermediary between PTAT current generator 6020 and oscillator core 6040.

As further shown in FIG. 16B, the gates of MOSFETS 6041 and 6042 within the oscillator core 6040 are biased by the reference voltage $V_{R2}$. In an initial state, the oscillator core 6040 receives the reference voltage $V_{R2}$ via the signal line 6039 (or reference voltage $V_{R1}$ via signal line 6029 in certain embodiments). Depending on the relative strengths of MOSFETs 6041-6044, the relative values of the resistors 6046 and 6047, the initial state of the system, and other factors known to those skilled in the art, the mirrored reference voltage $V_{R2}$ is configured to first turn on either MOSFETs 6041 and 6043, or MOSFETs 6042 and 6044. Assuming MOSFETs 6041 and 6043 are turned on first, a left branch current $I_3$ travels down the left branch from the supply voltage node 6001 through resistor 6046, MOSFET 6043, and MOSFET 6041. Some of the left branch current $I_3$ further branches off into a left capacitor charging current $I_5$ and begins charging the left node of a capacitor 6045. As the left node of the capacitor 6045 accumulates charge, the right node discharges a corresponding amount of charge, causing the voltage $V_6$ to decrease and causing the voltage difference $\Delta V_{36}$ between the voltages $V_3$ and $V_6$ to increase.

When $\Delta V_{36}$ becomes sufficiently large, MOSFET 6044 is able to turn on and a right branch current $I_4$ travels from the supply voltage node 6001 through a resistor 6047, MOSFET 6044, and MOSFET 6042. Some of the right branch current $I_4$ further branches off into a right capacitor charging current $I_6$ and begins charging the right node of the capacitor 6045. The voltage $V_4$ drops in response to the right branch current $I_4$ travelling through MOSFETs 6044 and 6042, which causes $\Delta V_{45}$ to decrease such that MOSFET 6043 is turned off and left branch current $I_3$ ceases being drawn.

As the right node of the capacitor 6045 accumulates charge, the left node discharges a corresponding amount of charge causing the voltage difference $\Delta V_{45}$ between voltages $V_4$ and $V_5$ to increase back towards its initial value. When $\Delta V_{45}$ becomes sufficiently large, MOSFET 6043 is able to turn on again and $I_3$ is drawn again in response. The voltage $V_3$ drops in response to the left branch current $I_3$ being drawn, which causes $\Delta V_{36}$ to decrease such that MOSFET 6044 is turned off and right branch current $I_4$ ceases being drawn. This process repeats, causing the voltage $V_3$ at the node supplying signal qp and the voltage $V_4$ at the node supplying signal $\overline{qp}$ to oscillate back-and-forth at a certain base frequency. The base oscillation frequency may be adjusted based on the capacitance value selected for capacitor 6045 and the total ON resistance of the left and right branches, as well as other conventional factors known to those skilled in the art.

Still referring to FIG. 16B, in some embodiments the oscillator core 6040 may instead be configured such that MOSFETs 6042 and 6044 turn on before MOSFETs 6041 and 6043 causing the right branch current $I_4$ to start being drawn. In these embodiments, the oscillator core 6040 functions in the same manner except that the initial order in which the MOSFETs are turned on is reversed. Over time, the right capacitor charging current $I_6$ causes $\Delta V_{45}$ to increase such that the left branch current $I_3$ is turned back on. When the left branch current $I_3$ turns on, $\Delta V_{36}$ decreases such that $I_4$ is turned off. The left capacitor charging current $I_5$ causes $\Delta V_{36}$ to increase until the right branch current $I_4$ is turned back on. When right branch current $I_4$ turns on, $\Delta V_{45}$ decreases such that the left branch current $I_3$ is turned off. This process repeats at a certain interval which corresponds to the fundamental frequency of the oscillator. The oscillating output signals qp and $\overline{qp}$ are each made smooth or pseudo-sinusoidal due to an integrating response of the capacitor 6045.

As discussed above, and as shown in FIG. 16B, in some embodiments, the oscillator core 6040 is coupled to the output buffer 6050 via the signal bus 6049 including signal lines 6055 and 6056. In this case, the nodes supplying voltages $V_3$ and $V_4$ are each coupled to the gate of MOSFET 6052 or MOSFET 6051, respectively. The presence of the output buffer may serve to square off the smooth or pseudo-sinusoidal oscillating signals $\overline{qp}$ and qp and responsively output differentially buffered output signal q as described above with respect to FIG. 12.

As the voltages $V_3$ and $V_4$ oscillate back-and-forth, MOSFETs 6052 and 6051 alternate between an ON state and an OFF state responsive to their gate-source voltage ($\Delta V_{37}$ or $\Delta V_{47}$ respectively) falling above and below their threshold voltage. In the example depicted in FIG. 16B, the gates of MOSFETS 6053 and 6054 are each coupled to the drain of MOSFET 6053, causing the output at node 6060 to differentially respond to the input signals qp and $\overline{qp}$ such that the value of the buffered signal q is always greater than zero. In other embodiments, a conventional non-differential output buffer may be implemented instead. In these embodiments, The drain nodes of MOSFET 6052 and MOSFET 6051 each produce buffered oscillating outputs that mirror the oscillation frequency of the oscillator core 6040. For example, the drain node of MOSFET 6052 may produce a buffered oscillating output signal q in response to the MOSFET 6052 oscillating between the ON state and the OFF state, while the drain node of MOSFET 6051 may produce a buffered oscillating output signal $\overline{q}$ in response to the MOSFET 6051 oscillating between the ON state and the OFF state.

In addition to squaring off the buffered output signal q or $\overline{q}$, the output buffer 6050 may, for example, provide the buffered signal q or $\overline{q}$ with enhanced signal characteristics, such as greater output impedance, relative to the oscillating signals qp or $\overline{qp}$. Those skilled in the art will appreciate that multiple output buffers similar to the output buffer 6050 may be included and cascaded in series to provide additional signal buffering to the oscillating signals qp or $\overline{qp}$.

Figure 17:
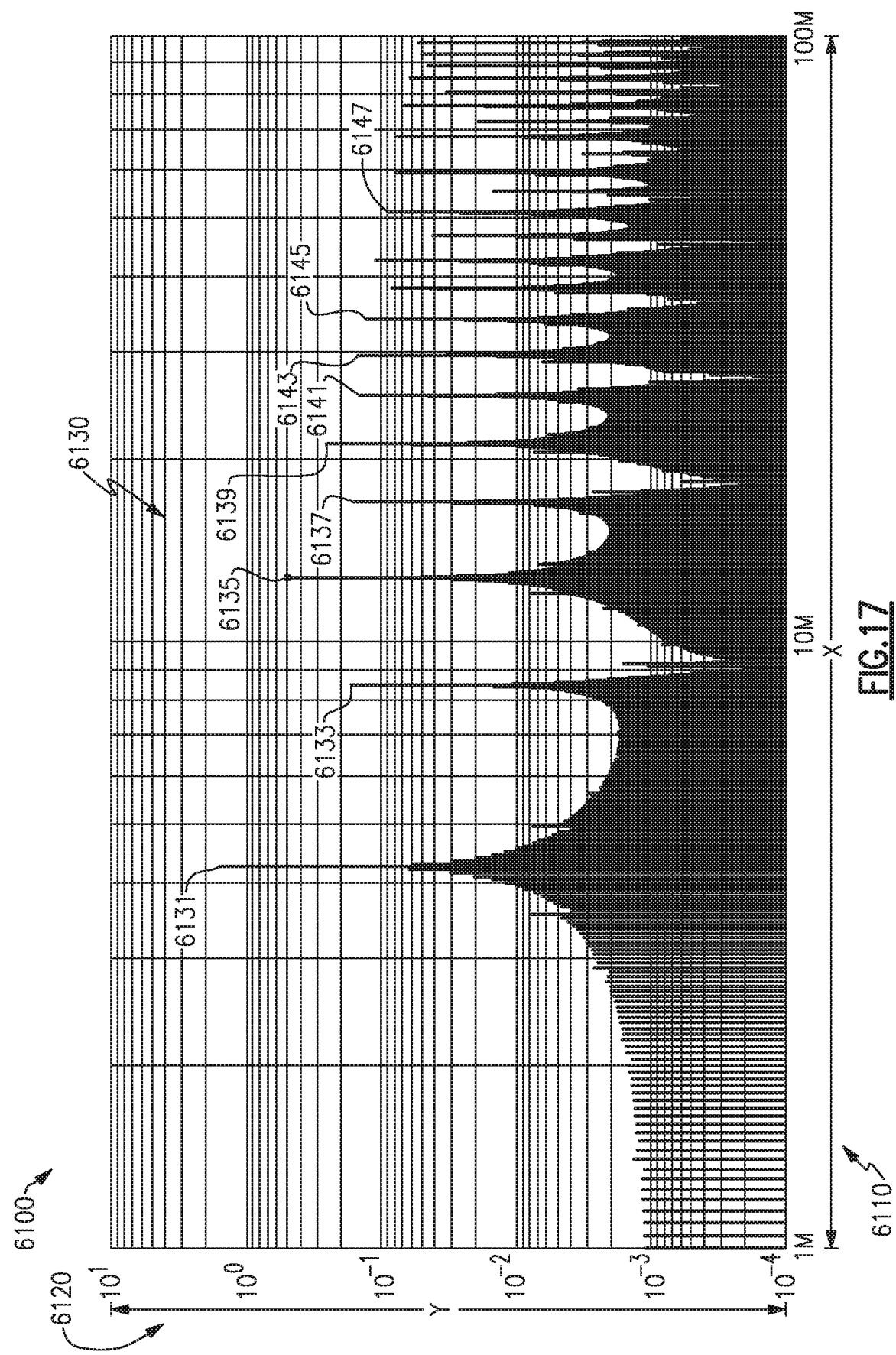
FIG. 17 is a graph depicting a signal strength versus frequency relationship of an output signal from the differential RC relaxation oscillator of FIG. 12.

FIG. 17 is a graph 6100 showing a signal-strength versus frequency relationship of an example of one of the oscillating signals qp or $\overline{qp}$ shown, for example, in FIGS. 7-8 and 10-13. The ability of this RC oscillator 6000 to produce an output signal with reduced harmonic content is illustrated in this graph as is described below. A logarithmic vertical (y) axis 6120 depicts the relative magnitude of the oscillating signal being measured 6130, while a logarithmic horizontal (x) axis 6110 depicts the frequency of the oscillating signal being measured 6130.

In this example, a primary signal component centered around signal component peak 6131 has an amplitude of approximately 1.6 V and frequency of approximately 4.2 MHz. The primary signal component peak 6131 represents the fundamental frequency (first harmonic) of the oscillating signal 6130. Proceeding from left-to-right, each subsequent signal component peak 6133, 6135, 6137, etc. represents successive signal harmonics. For example, the second harmonic 6133 has an amplitude of approximately 0.18 V and a frequency of approximately 8.4 MHz, the third harmonic 6135 has an amplitude of approximately 0.5 V and a frequency of approximately 12.6 MHz, the fourth harmonic 6137 has an amplitude of approximately 0.17 V and a frequency of approximately 16.8 MHz, and the fifth harmonic 6139 has an amplitude of approximately 0.26 V and a frequency of approximately 21 MHz, etc.

In various embodiments, the strength of signal 6130 at non-harmonic frequencies and at harmonic frequencies beyond the fundamental frequency 6131 is attenuated relative to the signal strength of the fundamental frequency 6131. For example, the strength of signal 6130 at each successive harmonic (beginning with the first harmonic 6131) and at non-harmonic frequencies can be attenuated relative to the signal strength of the fundamental frequency 6131. In various embodiments, such as the embodiment shown in FIGS. 16A-16B, a signal attenuation factor of at least 3 may be achieved for each harmonic and at non-harmonic frequencies relative to the fundamental frequency component. Still other levels of signal attenuation may be implemented in various other embodiments depending on the design constraints at issue and the components used to form the oscillator 6000.

As discussed above, in some embodiments, the RC oscillator 6000 may be coupled to additional systems—such as communication or power systems—that send or receive additional signals (such as various circuitry shown in the amplifier system 900 of FIG. 6). One or more of these additional signals may possess frequency content that overlaps one or more harmonic frequencies of signal 6030. The attenuation of each harmonic beyond the fundamental frequency 6133, 6135, 6137, 6139, etc. may, for example, prevent the harmonic frequencies of the oscillating signals qp, $\overline{qp}$, q, or $\overline{q}$ (as shown and described in various FIGS. herein) from unintentionally coupling to and potentially interfering with these additional signals. For example, the RC oscillator 6000 may be coupled to a power amplifier that amplifies signals in the DOCSIS 3.1 upstream communication band having frequencies between 5 MHz and 204 MHz. If the fundamental frequency 6131 of signal 6030 is at about 4 MHz, then each of the second through fiftieth harmonics will overlap the DOCSIS 3.1 band between 5 MHz and 204 MHz, while the fundamental frequency of 4 MHz will not overlap at all. Thus, the more attenuated each of these harmonics is, the less likely that signal 6030 will interfere with additional signals that are also coupled to RC oscillator 6000.

In other examples, the oscillating signals q or $\overline{q}$ output by the buffer 6050 at node 6060 (or alternatively the direct outputs qp, $\overline{qp}$ of the oscillator core 6040 if no buffer 6050 is present) may be further provided to one or more additional buffers (not shown), such as a digital buffer. The additional buffer may be coupled to a different supply voltage network (not shown) and ground network (not shown) than the oscillator 6000. In some cases, the additional buffer may "square-off" at least one of the smooth oscillating signals (q, $\overline{q}$, qp, $\overline{qp}$) output by the oscillator 6000 so that the logic high value and the logic low value are more well defined for use in a digital logic system. By coupling the additional buffer to the different supply voltage network and the different ground network, additional harmonic content that may be reintroduced by the additional buffer (when it squares-off the smooth oscillating signal) is prevented from coupling to the oscillator supply voltage 6001 and ground voltage 6002 since the additional buffer operates on different "rails" (the different supply voltage network and the different ground network as opposed to the oscillator supply voltage 6001 and ground voltage 6002).

Accordingly, any signal loss or interference potentially caused by the additional harmonic content introduced by the additional buffer(s) can be mitigated by coupling the additional buffer(s) to the separate rails as opposed to the supply voltage 6001 and ground voltage 6002 of the oscillator 6000. Other circuitry may be similarly decoupled from the different supply voltage network and different ground network (such as the various circuitry within the amplifier system 900 shown in FIG. 6). This allows signals within the other circuitry to be similarly protected from the additional harmonic content thereby reducing potential signal loss or interference caused by the additional harmonic content.

Figure 18:
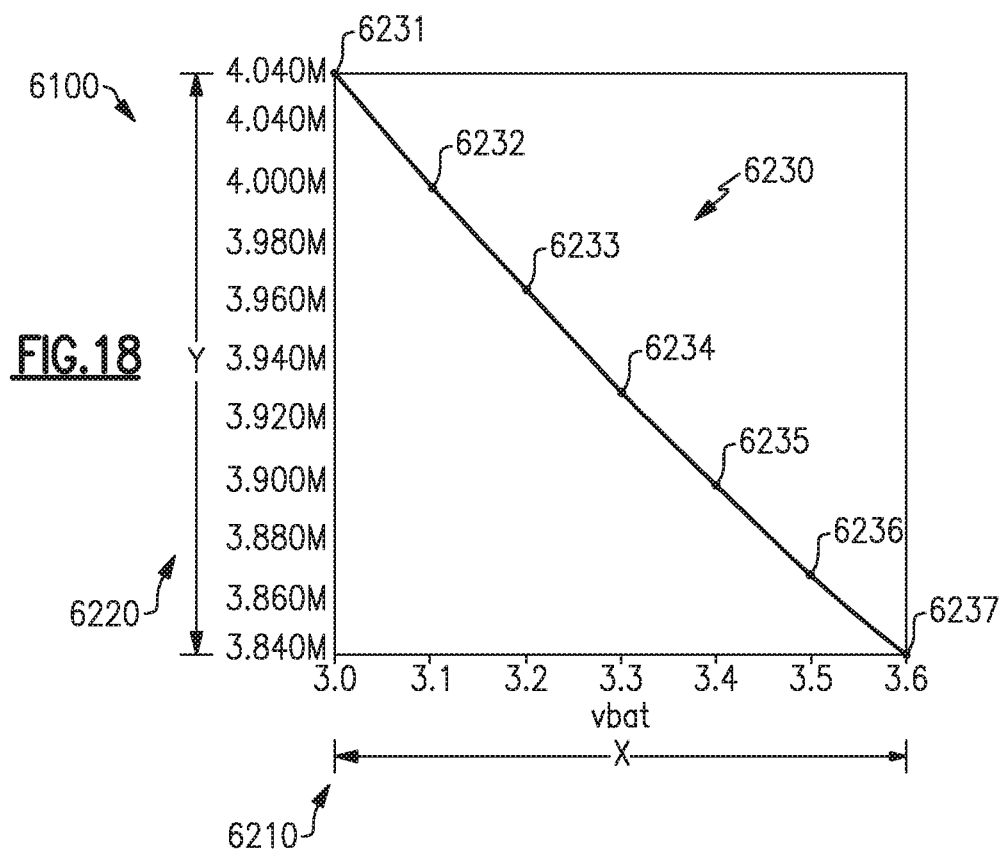
FIG. 18 is a graph depicting a fundamental frequency versus supply voltage relationship of an output signal from the differential RC relaxation oscillator of FIG. 12.
Figure 19:
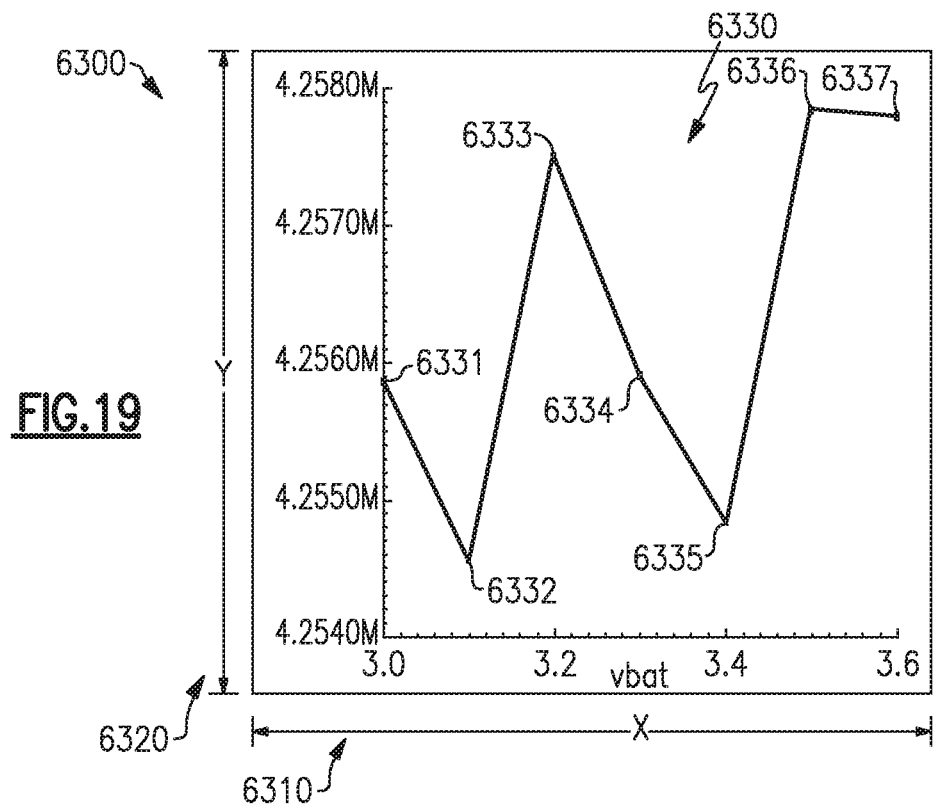
FIG. 19 is a graph depicting a fundamental frequency versus supply voltage relationship of an output signal from the differential RC relaxation oscillator of FIG. 13.

FIGS. 18 and 19 demonstrate how the addition of the low drop-out regulator (LDO) to the design of the RC oscillator 6000 may reduce variations in output frequency over a given range of supply voltages.

FIG. 18 is a graph 6200 showing a frequency versus supply voltage relationship 6230 of an example output of the oscillating signals qp, $\overline{qp}$, q, or $\overline{q}$ (as shown and described for example in FIGS. 10 and 12). A vertical (y) axis 6220 depicts the fundamental frequency of the signal being measured 6230, while a horizontal (x) axis 6210 depicts the magnitude of the supply voltage 6001. In this example, a first point 6231 has a supply voltage of 3 V and a fundamental frequency of approximately 4.04 MHz, a second point 6232 has a supply voltage of 3.1 V and a fundamental frequency of approximately 4 MHz, a third point 6233 has a supply voltage of 3.2 V and a fundamental frequency of approximately 3.97 MHz, a fourth point 6234 has a supply voltage of 3.3 V and a fundamental frequency of approximately 3.93 MHz, a fifth point 6235 has a supply voltage of 3.4 V and a fundamental frequency of approximately 3.9 MHz, a sixth point 6236 has a supply voltage of 3.5 V and a fundamental frequency of approximately 3.87 MHz, and a seventh point 6237 has a supply voltage of 3.6 V and a fundamental frequency of approximately 3.84 MHz. Accordingly, as the supply voltage varies between 3.0 V and 3.6 V, the fundamental frequency of the oscillating signal varies between 3.84 MHz and 4.04 MHz. The oscillator 6000 corresponding to the embodiment shown in FIG. 18 is therefore capable of achieving a frequency-voltage stability of 0.33 [MHz/V] and a variance of ±2.54% over a 0.6 V range. In various other embodiments, RC oscillator 6000 may be configured differently than the present example resulting in an alternate frequency versus supply voltage relationship 6200 for the oscillating signal 6230.

FIG. 19 is a graph 6300 showing a frequency versus low drop-out (LDO) regulated supply voltage relationship 6330 of an example of one of the oscillating signals qp, $\overline{qp}$, q, or $\overline{q}$ (as shown and described for example in FIGS. 11 and 13). A vertical (y) axis 6320 depicts the fundamental frequency of the signal being measured 6330, while a horizontal (x) axis 6310 depicts the magnitude of the LDO-regulated supply voltage 6004. In this example, a first point 6331 has a regulated supply voltage of 3 V and a fundamental frequency of approximately 4.2559 MHz, a second point 6332 has a regulated supply voltage of 3.1 V and a fundamental frequency of approximately 4.2546 MHz, a third point 6333 has a regulated supply voltage of 3.2 V and a fundamental frequency of approximately 4.2575 MHz, a fourth point 6334 has a regulated supply voltage of 3.3 V and a fundamental frequency of approximately 4.2559 MHz, a fifth point 6335 has a regulated supply voltage of 3.4 V and a fundamental frequency of approximately 4.2548 MHz, a sixth point 6336 has a regulated supply voltage of 3.5 V and a fundamental frequency of approximately 4.2579 MHz, and a seventh point 6337 has a regulated supply voltage of 3.6 V and a fundamental frequency of approximately 4.2578 MHz. Accordingly, as the supply voltage varies between 3.0 V and 3.6 V, the fundamental frequency of the oscillating signal varies between 4.2545 MHz and 4.2579 MHz. The oscillator 6000 corresponding to the embodiment shown in FIG. 19 is therefore capable of achieving a frequency-voltage stability of 5.67 [kHz/V] and a variance of ±0.04% over a 0.6 V range.

Comparing FIGS. 18 and 19, it can be seen that the LDO reduces variations in the fundamental output frequency over a given range of supply voltages 6001. The oscillator 6000 including an LDO shown in FIG. 19 can achieve a frequency-voltage stability of 5.67 [kHz/V] with a variance of ±0.04% over a 0.6 V range, whereas the oscillator 6000 excluding an LDO shown in FIG. 18 can achieve a frequency-voltage stability of 0.33 [MHz/V] a variance of ±2.54% over the 0.6 V range—the former being almost two orders of magnitude more stable than the latter. Accordingly, in some embodiments the addition of an LDO to RC oscillator 6000 may reduce the sensitivity of output frequency to changes in supply voltage by a factor of 50 or more over a supply voltage range between 3 and 3.6 V. Thus the inclusion of an LDO 6070 can significantly reduce the dependence of the RC oscillator 6000's fundamental output frequency in response to variations in supply voltage.

Figure 20:
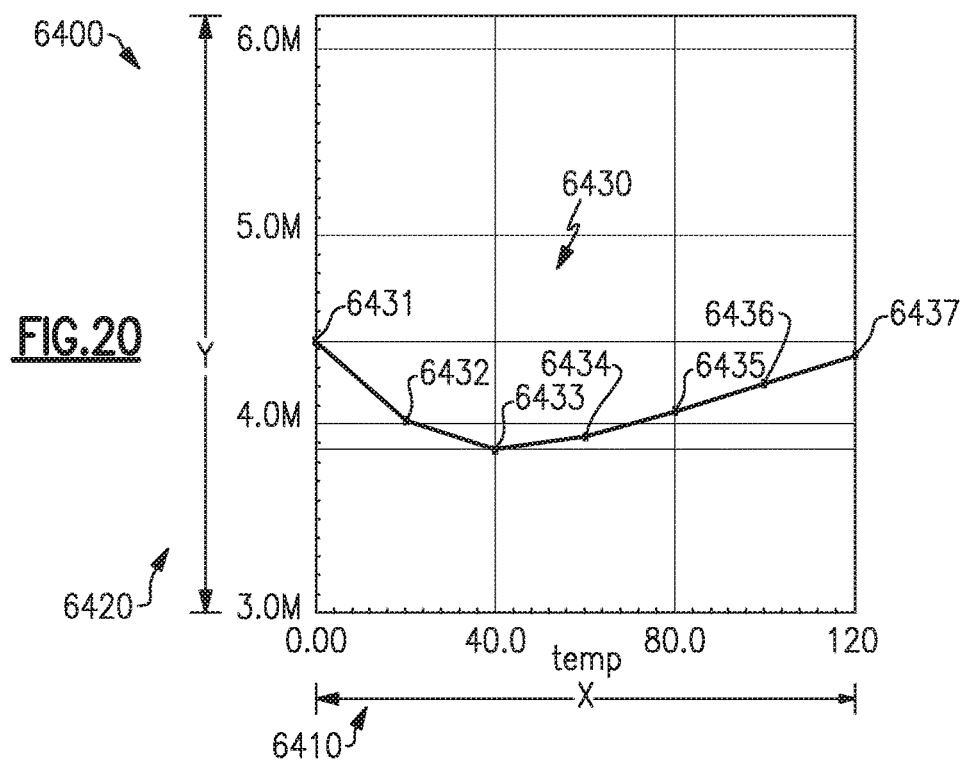
FIG. 20 is a graph depicting a fundamental frequency versus temperature relationship of an output signal from the differential RC relaxation oscillator of FIG. 12.
Figure 21:
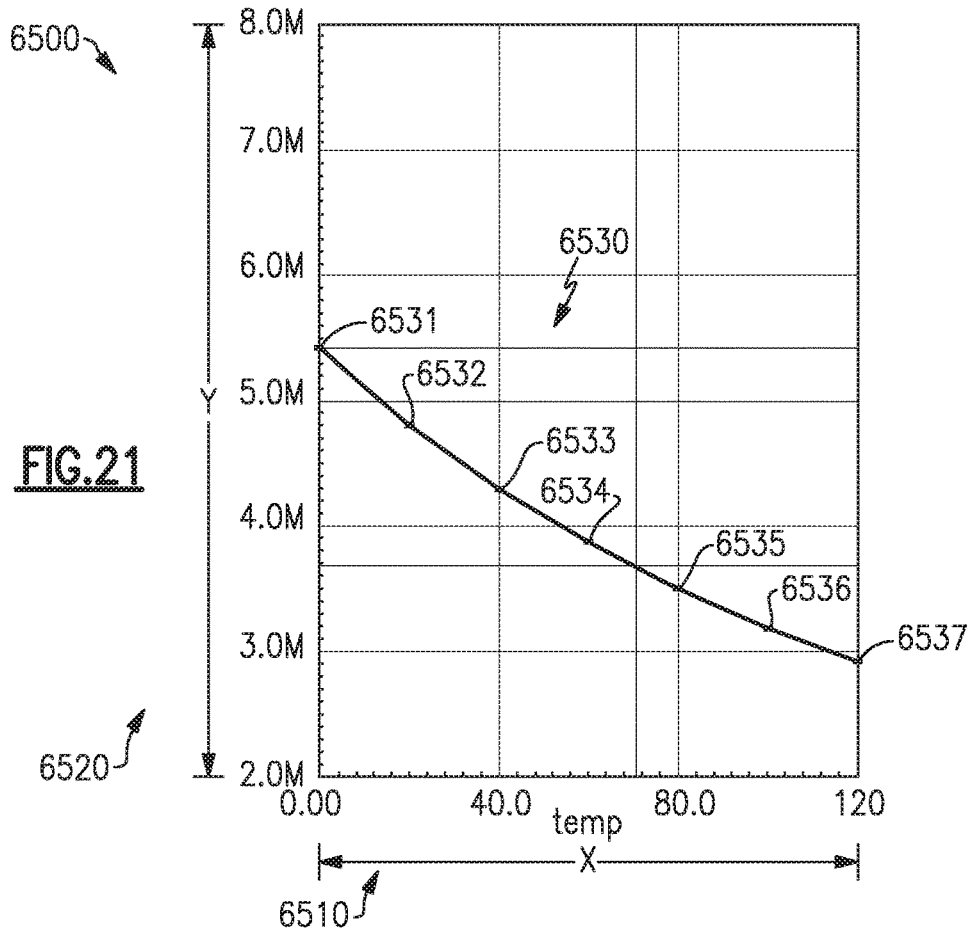
FIG. 21 is a graph depicting a fundamental frequency versus temperature relationship of an output signal of a differential RC relaxation oscillator that does not include a PTAT biasing unit.

FIGS. 20 and 21 demonstrate how the addition of the PTAT biasing unit 6020 to the design of RC oscillator 6000 may reduce variations in output frequency over a given range of temperatures.

FIG. 20 is a graph 6400 showing a fundamental frequency versus temperature relationship 6430 of an example one of the oscillating signals qp, $\overline{qp}$, q, or $\overline{q}$ (as shown and described for example in FIGS. 10-13 which include the PTAT biasing unit 6020). A vertical (y) axis 6420 depicts the fundamental frequency of the signal being measured 6430, while a horizontal (x) axis 6410 depicts the temperature. In this example, a first point 6431 has a temperature of 0° C. and a fundamental frequency of approximately 4.4 MHz, a second point 6432 has a temperature of 20° C. and a fundamental frequency of approximately 4 MHz, a third point 6433 has a temperature of 40° C. and a fundamental frequency of approximately 3.9 MHz, a fourth point 6434 has a temperature of 60° C. and a fundamental frequency of approximately 3.95 MHz, a fifth point 6435 has a temperature of 80° C. and fundamental frequency of approximately 4.1 MHz, a sixth point 6436 has a temperature of 100° C. and a fundamental frequency of approximately 4.2 MHz, and a seventh point 6437 has a temperature of 120° C. and a fundamental frequency of approximately 4.35 MHz. Accordingly, as the temperature varies between 0° C. and 120° C., the fundamental frequency of the oscillating signal varies between 3.87 MHz and 4.42 MHz. The oscillator 6000 corresponding to the embodiment shown in FIG. 20 is therefore capable of achieving a frequency-temperature stability of 4.58 [kHz/° C.] and a variance of ±6.63% over a 120° C. range. In various other embodiments, RC oscillator 6000 may be configured differently than the present example resulting in an alternate fundamental frequency versus temperature relationship 6400 for the oscillating signal 6430.

FIG. 21 is a graph 6500 showing a fundamental frequency versus temperature relationship 6530 of an example one of an oscillating output signal produced by an RC oscillator similar to the one shown in FIGS. 10-13, but excluding a PTAT biasing unit 6030 and instead being biased by a conventional reference current or reference voltage. A vertical (y) axis 6520 depicts the fundamental frequency of the signal being measured 6530, while a horizontal (x) axis 6510 depicts the temperature. In this example, a first point 6531 has a temperature of 0° C. and a fundamental frequency of approximately 5.4 MHz, a second point 6532 has a temperature of 20° C. and a fundamental frequency of approximately 4.8 MHz, a third point 6533 has a temperature of 40° C. and a fundamental frequency of approximately 4.3 MHz, a fourth point 6534 has a temperature of 60° C. and a fundamental frequency of approximately 3.9 MHz, a fifth point 6535 has a temperature of 80° C. and a fundamental frequency of approximately 3.5 MHz, a sixth point 6536 has a temperature of 100° C. and a fundamental frequency of approximately 3.2 MHz, and a seventh point 6537 has a temperature of 120° C. and a fundamental frequency of approximately 2.9 MHz. Accordingly, as the temperature varies between 0° C. and 120° C., the fundamental frequency of the oscillating signal varies between 2.9 MHz and 5.4 MHz. The oscillator 6000 corresponding to the embodiment shown in FIG. 20 is therefore capable of achieving a frequency-temperature stability of 20.83 [kHz/° C.] and a variance of ±30.1% over a 120° C. range.

Comparing FIGS. 20 and 21, it can be seen that the inclusion of a PTAT biasing unit reduces variations in the fundamental output frequency over a given range of temperature conditions. The oscillator 6000 including the PTAT biasing unit shown in FIG. 20 can achieve a frequency-temperature stability of 4.58 [kHz/° C.] and a variance of ±6.63% over a 120° C. range, whereas the oscillator 6000 excluding the PTAT biasing unit shown in FIG. 21 can achieve a frequency-temperature stability of 20.83 [kHz/° C.] and a variance of ±30.1% over the 120° C. range—the former being over four times more stable than the latter. Accordingly, in some embodiments the addition of a PTAT biasing unit to the RC oscillator 6000 may reduce the sensitivity of output frequency to changes in temperature by a factor of four or more over a temperature range between 0 and 120° C. Thus the inclusion of a PTAT biasing unit 6020 can significantly reduce the dependence of the RC oscillator 6000's fundamental output frequency in response to variations in temperature.

The inclusion of PTAT biasing unit 6030 may further keep the fundamental frequency of output signal 6430 below a certain frequency threshold at lower temperatures. For example, the fundamental frequency of output signal 6430 is below 5 MHz at 0° C., whereas the fundamental frequency of output signal 6530 exceeds 5 MHz at 0° C. By maintaining the fundamental frequency of the oscillator core's 6040 output below a certain threshold, undesirable interference with an external signal may be minimized or avoided. For example, by keeping the fundamental frequency of the oscillating output signals qp, $\overline{qp}$, q, or $\overline{q}$ (as shown and described for example in FIGS. 10-13) below 5 MHz over the entire expected temperature range of 0° C. to 120° C., undesirable interference with the DOCSIS 3.1 communications signals operating between 5 MHz and 204 MHz may be reduced or avoided.

Thus, aspects and embodiments provide an RC oscillator and associated methods can produce an oscillating clock signal with an adjustable fundamental frequency that is relatively stable with temperature. As discussed above, the RC oscillator includes an oscillator core, together with PTAT biasing unit and optionally additional circuitry. The oscillator core may be configured to generate a clock signal having a smooth or pseudo-sinusoidal waveform with attenuated harmonic content relative to a square-wave signal. The biasing unit may be configured to possess a reduced temperature dependence to stabilize the fundamental frequency of the oscillating signal over temperature variations. The supply voltage may be fed through a low drop-out regulator to further stabilize the fundamental frequency of the oscillating signal over supply voltage variations. The RC oscillator may be coupled to, and in some cases co-fabricated with, a larger digital logic system, such as a power amplifier control system.

Having described above several aspects of at least one implementation, it is to be appreciated various alterations, modifications, and improvements will readily occur to those skilled in the art. Such alterations, modifications, and improvements are intended to be part of this disclosure and are intended to be within the scope of the description. Accordingly, the foregoing description and drawings are by way of example only, and the scope of the disclosure should be determined from proper construction of the appended claims, and their equivalents.

What is claimed is:

1. A relaxation oscillator comprising:
a proportional to absolute temperature (PTAT) biasing unit configured to output a constant bias signal via a bias signal line;
a voltage-controlled RC relaxation oscillator core including first and second cross-coupled MOSFETs each having a gate, a source, and a drain, and a capacitor coupled between the source of the first MOSFET and the source of the second MOSFET, the gate of the first MOSFET being coupled to the drain of the second MOSFET and the gate of the second MOSFET being coupled to the drain of the first MOSFET, the oscillator core being coupled to the bias signal line and configured to generate at least one oscillating signal in response to receiving the bias signal; and
an enable unit including an enable transistor coupled to the bias signal line and positioned between the PTAT biasing unit and the oscillator core, the enable unit configured to operate the relaxation oscillator in an active mode to allow the oscillator core to generate the at least one oscillating signal by controlling the enable transistor to direct the bias signal to the oscillator core and to operate the relaxation oscillator in a sleep mode to prevent the oscillator core from generating the at least one oscillating signal by controlling the enable transistor to direct the bias signal away from the oscillator core.

2. The relaxation oscillator of claim 1 wherein the enable transistor is coupled between the bias signal line and ground.

3. The relaxation oscillator of claim 2 wherein the enable unit is configured to operate the relaxation oscillator in the sleep mode by turning on the enable transistor to shunt the bias signal to ground.

4. The relaxation oscillator of claim 3 wherein the enable unit is configured to operate the relaxation oscillator in the active mode by turning off the enable transistor.

5. The relaxation oscillator of claim 4 wherein the oscillator core comprises a first branch including the first MOSFET and configured to output a first oscillating signal, a second branch including the second MOSFET and configured to output a second oscillating signal, wherein the gate of the first MOSFET is coupled to the second branch and the gate of the second MOSFET is coupled to the first branch.

6. The relaxation oscillator of claim 5 wherein the first branch includes a first current source coupled to the bias signal line and the second branch includes a second current source coupled to the bias signal line.

7. The relaxation oscillator of claim 6 wherein the bias signal is configured to enable the first current source to draw current through the first branch to generate the first oscillating signal and to enable the second current source to draw current through the second branch to generate the second oscillating signal.

8. The relaxation oscillator of claim 5 wherein a fundamental frequency of the first and second oscillating signals varies by less than plus or minus ten percent when operating over a temperature range between 0° C. and 120° C.

9. The relaxation oscillator of claim 8 wherein the fundamental frequency of the first and second oscillating signals is between 3.8 MHz and 4.5 MHz when the oscillator core is operating at a temperature between 0° C. and 120° C.

10. A relaxation oscillator comprising:
a proportional to absolute temperature (PTAT) biasing unit configured to output a constant bias signal via a bias signal line;
an additional biasing unit coupled to the bias signal line and configured to receive the bias signal from the PTAT biasing unit and provide an output signal via an output signal line based on the bias signal;
a voltage-controlled RC relaxation oscillator core including first and second cross-coupled MOSFETs each having a gate, a source, and a drain, and a capacitor coupled between the source of the first MOSFET and the source of the second MOSFET, the gate of the first MOSFET being coupled to the drain of the second MOSFET and the gate of the second MOSFET being coupled to the drain of the first MOSFET, the oscillator core being coupled to the output signal line and configured to generate at least one oscillating signal in response to receiving the output signal; and
an enable unit including an enable transistor coupled to the output signal line and positioned between the additional biasing unit and the oscillator core, the enable unit configured to operate the relaxation oscillator in an active mode to allow the oscillator core to generate the at least one oscillating signal by controlling the enable transistor to direct the output signal to the oscillator core and to operate the relaxation oscillator in a sleep mode to prevent the oscillator core from generating the at least one oscillating signal by controlling the enable transistor to direct the output signal away from the oscillator core.

11. The relaxation oscillator of claim 10 wherein the enable transistor is coupled between the output signal line and ground.

12. The relaxation oscillator of claim 11 wherein the enable unit is configured to operate the relaxation oscillator in the sleep mode by turning on the enable transistor to shunt the output signal to ground.

13. The relaxation oscillator of claim 12 wherein the enable unit is configured to operate the relaxation oscillator in the active mode by turning off the enable transistor.

14. The relaxation oscillator of claim 13 wherein the oscillator core comprises a first branch including the first MOSFET and configured to output a first oscillating signal, a second branch including the second MOSFET and configured to output a second oscillating signal, wherein the gate of the first MOSFET is coupled to the second branch and the gate of the second MOSFET is coupled to the first branch.

15. The relaxation oscillator of claim 14 wherein the first branch includes a first current source coupled to the output signal line and the second branch includes a second current source coupled to the output signal line.

16. The relaxation oscillator of claim 15 wherein the output signal is configured to enable the first current source to draw current through the first branch to generate the first oscillating signal and to enable the second current source to draw current through the second branch to generate the second oscillating signal.

17. The relaxation oscillator of claim 14 wherein a fundamental frequency of the first and second oscillating signals varies by less than plus or minus ten percent when operating over a temperature range between 0° C. and 120° C.

18. The relaxation oscillator of claim 17 wherein the fundamental frequency of the first and second oscillating signals is between 3.8 MHz and 4.5 MHz when the oscillator core is operating at a temperature between 0° C. and 120° C.

19. A method of operating a relaxation oscillator having an active mode of operation and a sleep mode of operation, the method comprising:
   generating a constant bias signal in a proportional-to-absolute temperature (PTAT) biasing unit;
   generating at least one oscillating signal in the active mode of operation by directing the bias signal to a voltage-controlled RC relaxation oscillator core; and
   preventing the oscillator core from generating the at least one oscillating signal in the sleep mode of operation by directing the bias signal away from the oscillator core.

20. The method of claim 19 wherein preventing the oscillator core from generating the at least one oscillating signal includes shunting the bias signal line to ground to prevent the bias signal from enabling the oscillator core and generating the at least one oscillating signal.

* * * * *

UNITED STATES PATENT AND TRADEMARK OFFICE
CERTIFICATE OF CORRECTION

| | | |
|---|---|---|
| PATENT NO. | : 10,998,862 B2 | Page 1 of 1 |
| APPLICATION NO. | : 16/579120 | |
| DATED | : May 4, 2021 | |
| INVENTOR(S) | : Bang Li Liang et al. | |

It is certified that error appears in the above-identified patent and that said Letters Patent is hereby corrected as shown below:

In the Specification

Column 1, Line 3, insert -- CROSS-REFERENCE TO RELATED APPLICATIONS -- after the Title.

Signed and Sealed this
Fifteenth Day of June, 2021

Drew Hirshfeld
*Performing the Functions and Duties of the
Under Secretary of Commerce for Intellectual Property and
Director of the United States Patent and Trademark Office*